United States Patent
Nakata

(10) Patent No.: US 11,064,182 B2
(45) Date of Patent: Jul. 13, 2021

(54) IMAGING APPARATUS

(71) Applicant: Sony Interactive Entertainment Inc., Tokyo (JP)

(72) Inventor: Masashi Nakata, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 16/644,260

(22) PCT Filed: Sep. 7, 2018

(86) PCT No.: PCT/JP2018/033266
§ 371 (c)(1),
(2) Date: Mar. 4, 2020

(87) PCT Pub. No.: WO2019/054304
PCT Pub. Date: Mar. 21, 2019

(65) Prior Publication Data
US 2020/0204786 A1    Jun. 25, 2020

(30) Foreign Application Priority Data

Sep. 15, 2017    (JP) .............................. JP2017-178302

(51) Int. Cl.
*H04N 13/00* (2018.01)
*H04N 13/218* (2018.01)
(Continued)

(52) U.S. Cl.
CPC ......... *H04N 13/218* (2018.05); *G02B 5/3058* (2013.01); *H04N 5/2254* (2013.01); *G03B 11/00* (2013.01)

(58) Field of Classification Search
CPC ......... H04N 5/232122; H04N 5/36961; H04N 5/2254; H04N 5/2258; H04N 13/296;
(Continued)

(56) References Cited

U.S. PATENT DOCUMENTS 8,254,712 B2 * 8/2012 Yoda .................. G06K 9/00597
382/255
8,310,538 B2   11/2012 Yanagita
(Continued)

FOREIGN PATENT DOCUMENTS

JP     06141246 A    5/1994
JP    2000112019 A   4/2000
(Continued)

OTHER PUBLICATIONS

International Search Report for corresponding PCT Application No. PCT/JP2018/033266, 4 pages, dated Nov. 6, 2018.
(Continued)

*Primary Examiner* — Robert Chevalier
(74) *Attorney, Agent, or Firm* — Matthew B. Dernier, Esq.

(57) ABSTRACT

An imaging apparatus includes a large imaging section, a plurality of small imaging sections, and an image processing section. The plurality of small imaging sections are smaller in optical size than the large imaging section. The large imaging section captures an image of a subject outside the imaging apparatus. The plurality of small imaging sections are provided at positions around the large imaging section to capture images of the subject. The image processing section generates data to be output on the basis of the image captured by the large imaging section and the images captured by the plurality of small imaging sections.

18 Claims, 23 Drawing Sheets

(51) Int. Cl.
*G02B 5/30* (2006.01)
*H04N 5/225* (2006.01)
*G03B 11/00* (2021.01)

(58) Field of Classification Search
CPC ............... H04N 13/257; H04N 13/218; H04N 9/04551; G02B 7/30; G02B 7/34; G02B 5/3058; G03B 19/06; G03B 13/36; G03B 35/10; G03B 11/00; H01L 27/146; H01L 27/14621; H01L 27/14627
USPC ...... 348/49, 42, 46, 47, 48, 50; 86/210, 209, 86/224, 223
See application file for complete search history.

(56) References Cited

U.S. PATENT DOCUMENTS

| | | |
|---|---|---|
| 9,143,756 B2 | 9/2015 | Ogasawara |
| 9,204,128 B2 | 12/2015 | Morioka |
| 9,787,924 B2 | 10/2017 | Tezuka |
| 2001/0022858 A1 | 9/2001 | Komiya |
| 2011/0298917 A1 | 12/2011 | Yanagita |
| 2012/0188336 A1 | 7/2012 | Ogasawara |
| 2013/0107015 A1* | 5/2013 | Morioka ................. G06T 7/593 348/48 |
| 2013/0342641 A1 | 12/2013 | Morioka |
| 2016/0088253 A1 | 3/2016 | Tezuka |

FOREIGN PATENT DOCUMENTS

| | | |
|---|---|---|
| JP | 2007295113 A | 11/2007 |
| JP | 2009048033 A | 3/2009 |
| JP | 2012156775 A | 8/2012 |
| JP | 2017016431 A | 1/2017 |
| WO | 2011114572 A1 | 9/2011 |
| WO | 2013099169 A1 | 7/2013 |
| WO | 2014196216 A1 | 12/2014 |

OTHER PUBLICATIONS

International Preliminary Report on Patentability for corresponding PCT Application No. PCT/JP2018/033266, 22 pages, dated Mar. 26, 2020.

* cited by examiner (a)　　　　(b)　　　　(c)

IMAGING APPARATUS 500

IMAGING APPARATUS 500

IMAGING APPARATUS

TECHNICAL FIELD

The present invention relates to an imaging apparatus.

BACKGROUND ART

In the case where a three-dimensional (3D) video having parallax to be displayed on a head-mounted display or other apparatuses was shot, two cameras of the same kind were typically arranged to capture images of a subject.

CITATION LIST

Patent Literature

[PTL 1] Japanese Patent Laid-Open No. 2017-16431

SUMMARY

Technical Problems

Conventional techniques of shooting a 3D video have had the following problems. Firstly, if, while a user views a video on a head-mounted display, a line connecting the two eyes of the user is slanting or upright as a result of inclination of his or her head to the side, a difference arises from the camera position during shooting, thus making it difficult to acquire appropriate parallax. Secondly, if the two cameras are both increased in optical size to achieve a higher image quality, this leads to an upsized camera system as a whole. Thirdly, a blind spot occurs at a proximity distance between the lenses of a large camera.

The present invention has been devised in light of the foregoing problems, and it is an object of the present invention to provide an improved technology for providing a suitable 3D video.

Solution to Problems

In order to solve the above problems, an imaging apparatus of an aspect of the present invention includes a first imaging section, a plurality of second imaging sections, and an image processing section. The first imaging section captures an image of a subject. The plurality of second imaging sections are provided at positions around the first imaging section to capture images of the subject and are smaller in optical size than the first imaging section. The image processing section generates data to be output on a basis of the image captured by the first imaging section and the images captured by the plurality of second imaging sections.

It should be noted that any combination of the above constituent elements and conversions of the expressions of the present invention between a system, a computer program, a recording medium recording the computer program in a readable manner, data structure, and so on are also effective as modes of the present invention.

Advantageous Effect of Invention

The present invention can support the provision of a suitable 3D video.

DESCRIPTION OF EMBODIMENTS (Related Technology)

Figure 1:
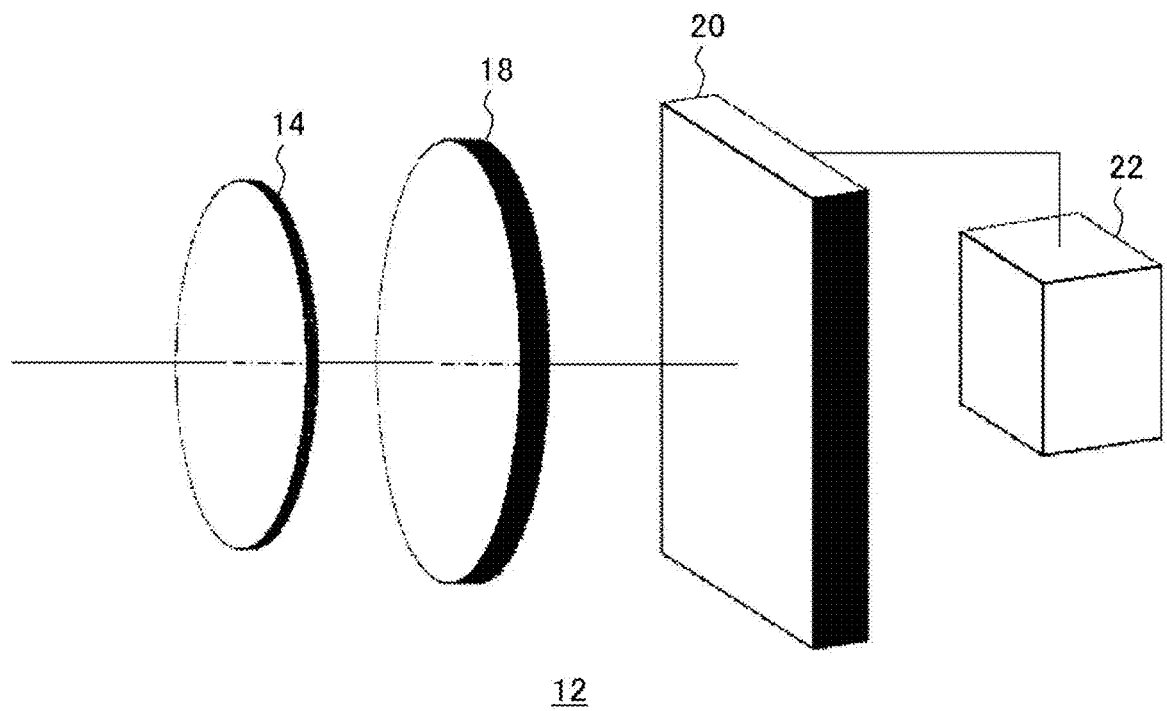
FIG. 1 is a diagram conceptually illustrating a configuration of an imaging apparatus in a related technology.

FIG. 1 is a diagram conceptually illustrating a configuration of an imaging apparatus in the present embodiment. An imaging apparatus 12 includes an image forming optics 14, an aperture 18, an imaging element 20, and an image processing section 22. The image forming optics 14 has an ordinary configuration including a focusing lens that forms a subject image on an imaging surface of the imaging element 20. It should be noted that FIG. 1 typically illustrates a single lens. The aperture 18 includes an opening portion and has an ordinary configuration for adjusting the amount of incident light by changing a diameter of the aperture.

The imaging element 20 has a second-dimensional (2D) layout of pixels, converting intensity of incident light into electric charge and outputting the electric charge to the image processing section 22. Pixels in the present embodiment include, at least, a microlens, a polarizer, and photodiodes that are integrally stacked one on top of the other. Here, a plurality of photodiodes are provided for each microlens, thus providing phase difference images obtained by dividing incident light into two images. In the description given below, we assume that a region corresponding to a microlens is a pixel region.

That is, a plurality of photodiodes are provided for each pixel. It should be noted that although a photodiode is a typical example of a mechanism that converts the intensity of incident light into electric charge, there is no intention to limit the present embodiment thereto. That is, the present embodiment can be similarly realized by adopting any photoelectric conversion mechanism in place of photodiodes, and any mechanism for converting light into electric charge can be used to replace photodiodes. Also, a polarizer may be provided in each of all pixels or discretely in some pixels.

The image processing section 22 performs image processing using a 2D distribution of luminance of light output from the imaging element 20, generating an ordinary color image and a distance image representing distances to the subject with pixel values. It should be noted that the imaging apparatus 12 may further include operation means manipulated by the user and a mechanism for performing an imaging action to suit the operation content and an adjusting action of imaging condition. Also, the imaging apparatus 12 may further include a mechanism for establishing communication with an external information processing apparatus such as gaming console in a wired or wireless manner and sending generated data and receiving control signals such as data transmission request. It should be noted, however, that these mechanisms need only be similar to those of ordinary imaging apparatuses. Therefore, the description thereof is omitted.

Figure 2:
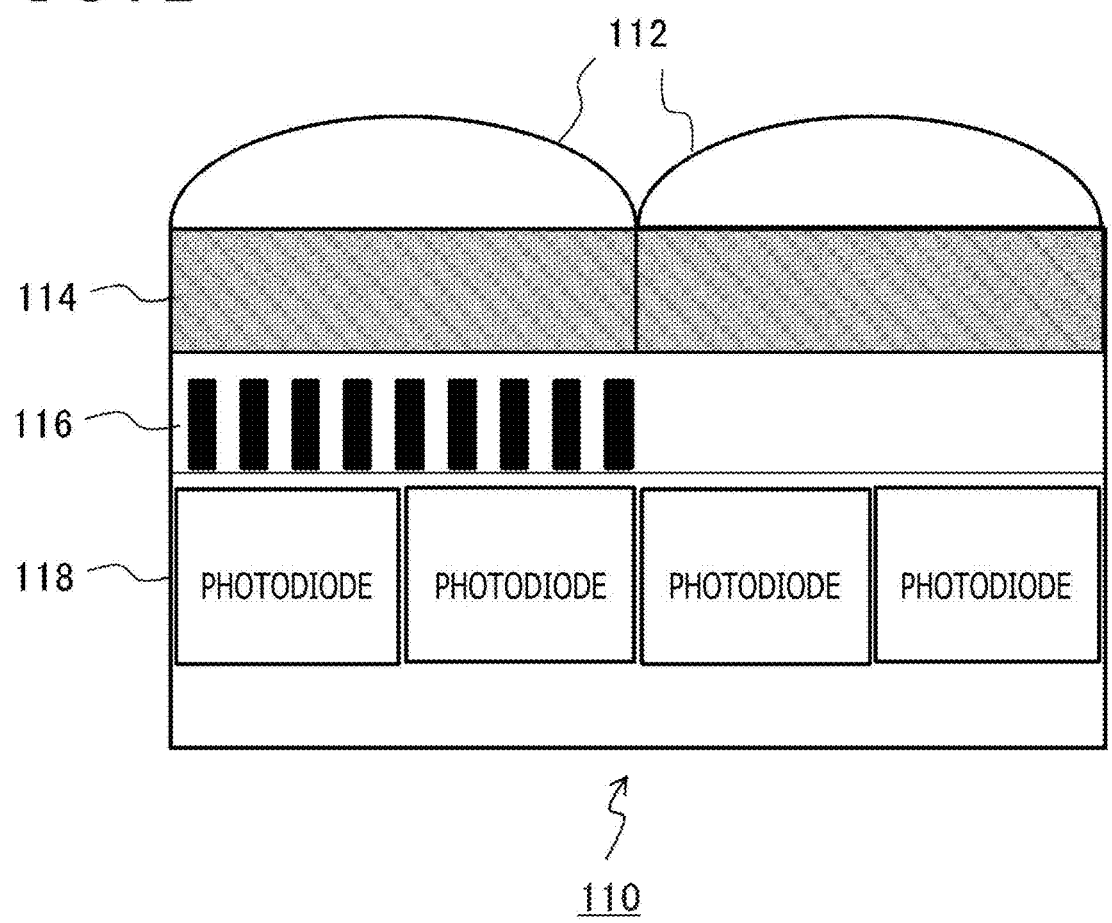
FIG. 2 is a diagram illustrating a structural example of pixels of the imaging apparatus in the related technology.

FIG. 2 illustrates a structural example of pixels of the imaging apparatus 12. It should be noted that FIG. 2 schematically illustrates a functional structure of a cross section of an element, and a detailed structure such as interlayer insulating film and wiring are not depicted. Also, FIG. 2 illustrates a cross-sectional structure of two pixels adjacent to each other. A pixel 110 includes a microlens layer 112, a color filter layer 114, a polarizer layer 116, and a photoelectric conversion layer 118. The microlens layer 112 is provided for each pixel and converges incident light that enters the microlens layer 112 via the aperture 18.

The color filter layer 114 allows passage of light of a different color for each pixel. The polarizer layer 116 includes a wire grid polarizer formed by arranging a plurality of linear conductor members such as tungsten or aluminum members (wires) in a striped pattern at an interval smaller than a wavelength of incident light. When light that has been converged by the microlens layer 112 and that has passed through the color filter layer 114 enters the polarizer layer 116, polarization components parallel to a polarizer line are reflected, thus allowing passage of only those polarization components perpendicular to the polarizer line.

Polarization luminance is acquired by converting the polarization components that have passed through the photoelectric conversion layer 118 into electric charge. The technology for acquiring an image by using a wire grid polarizer as illustrated in FIG. 2 is disclosed, for example, in Japanese Patent Laid-Open No. 2012-80065. It should be noted, however, that the element structure of the imaging apparatus 12 in the present embodiment is not limited to that illustrated. For example, the polarizer is not limited to the wire grid type and may be any one of commercial polarizers such as linear dichroic polarizer. It should be noted that although FIG. 2 illustrates the cross section of wires that extend in a depth direction, there are four principal axis angles for the polarizer, and the wire orientation varies depending on the principal axis angle.

Also, as illustrated in FIG. 2, the pixel has a polarizer in some regions of the polarizer layer 116 and has no polarizer in other regions thereof. In the regions where no polarizer is provided, light that has passed through the color filter layer 114 enters the photoelectric conversion layer 118 in an 'as-is' manner. The photoelectric conversion layer 118 includes ordinary photodiodes and outputs incident light as electric charge. In the present embodiment as described above, a plurality of photodiodes are provided for each microlens, thus allowing light beams that have passed through different regions of the focusing lens to be converted into electric charge separately.

The technology for detecting a focal point on the basis of a phase difference between the light beams detected in this manner has been commercialized as a phase difference autofocus technique (refer, for example, to Japanese Patent Laid-Open No. 2013-106194). In the present embodiment, the distance to a subject is acquired by taking advantage of phase difference. Summing up the detected values of the plurality of photodiodes provided in a pixel provides luminance for one pixel in an ordinary imaging apparatus. That is, the pixel configuration illustrated in FIG. 2 allows an ordinary color image, a distance image, and a polarization image to be acquired at the same time.

Figure 3:
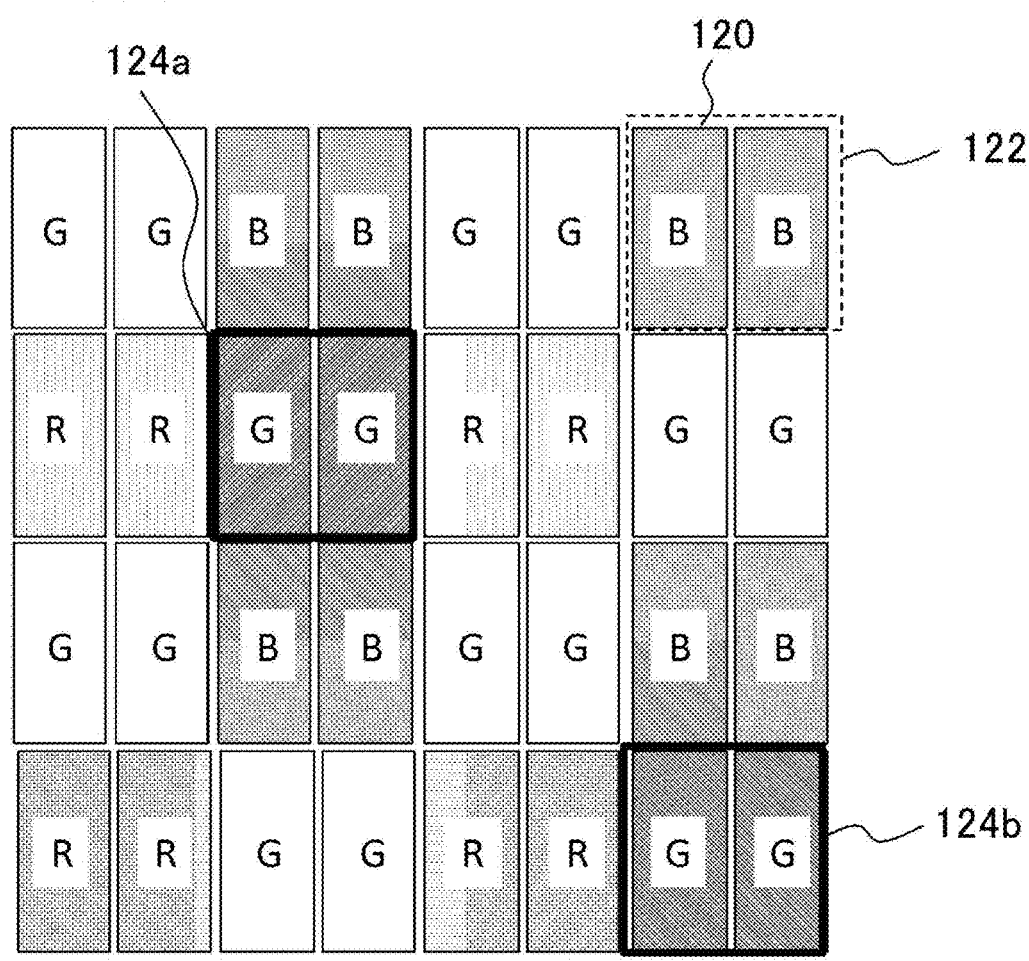
FIG. 3 is a diagram illustrating a pixel arrangement in an imaging element of the related technology.

FIG. 3 illustrates a pixel arrangement in the imaging element 20. This figure schematically illustrates a combination of layers when some regions of the imaging element 20 are viewed from above, with each vertically long rectangle representing a photodiode (e.g., photodiode 120). A pair of left and right photodiodes correspond to a pixel (e.g., pixel 122). Also, color filters in the color filter layer 114 are arranged in Bayer pattern, and one of red, green, and blue light beams is detected in each pixel. In FIG. 3, these pixels are denoted by letters "R," "G," and "B," respectively.

Also, a polarizer is provided in each of pixels 124a and 124b that are depicted with bold frames. Bold diagonal lines in the pixels 124a and 124b represent wires included in the polarizers. That is, the pixels 124a and 124b include polarizers that differ in principal axis angle. Although FIG. 3 illustrates two types of polarizers whose principal axis angles are orthogonal to each other, four types of polarizers having principal axis angles spaced at intervals of 45 degrees are further provided by using another pixel.

Each of the polarizers allows passage of polarization components orthogonal to the direction of wires. This allows the photodiodes provided in an underlying layer to output electric charge representing luminance of the polarization components in four directions spaced at intervals of 45 degrees. In the case where only the luminance of polarization is to be acquired from the pixel in question, the detected values of two photodiodes provided in a pixel may be added up. In Bayer pattern, the highest pixel density is assigned to green (G). In this example, therefore, polarizers are provided in the green pixels.

This makes it possible to bring the pixels with a polarizer relatively close to each other and acquire luminance of polarization of the same color in a plurality of directions at high resolution. Separation of this for each polarization direction and interpolation thereof provides polarization images in four directions. It is possible to acquire normal vectors of the subject surface by using the polarization images in question. The normal vectors represent inclinations of minute regions of the subject surface. Therefore, the distance values of feature points acquired on the basis of phase difference can be interpolated by using the normal vectors. Images having the same viewpoint shot with the same imaging apparatus 12 provides distance values and normal vectors at the same time through phase difference, thus realizing accurate interpolation with no need for positioning and other processes.

It should be noted that in the case where a color image is not used for image display or for other purposes, the color filter layer 114 may be removed from the pixel 110. In this case, a luminance image, a distance image, and a normal image can be acquired. Alternatively, cyan, magenta, and other dye-based filters may be used as color filters. Also, the arrangement illustrated in FIG. 3 is merely an illustration, there is no intention to limit the pixel arrangement of the present embodiment thereto. For example, the density of pixels with a polarizer may be increased further. Alternatively, a polarizer may be provided in each of all the pixels.

Figure 4:
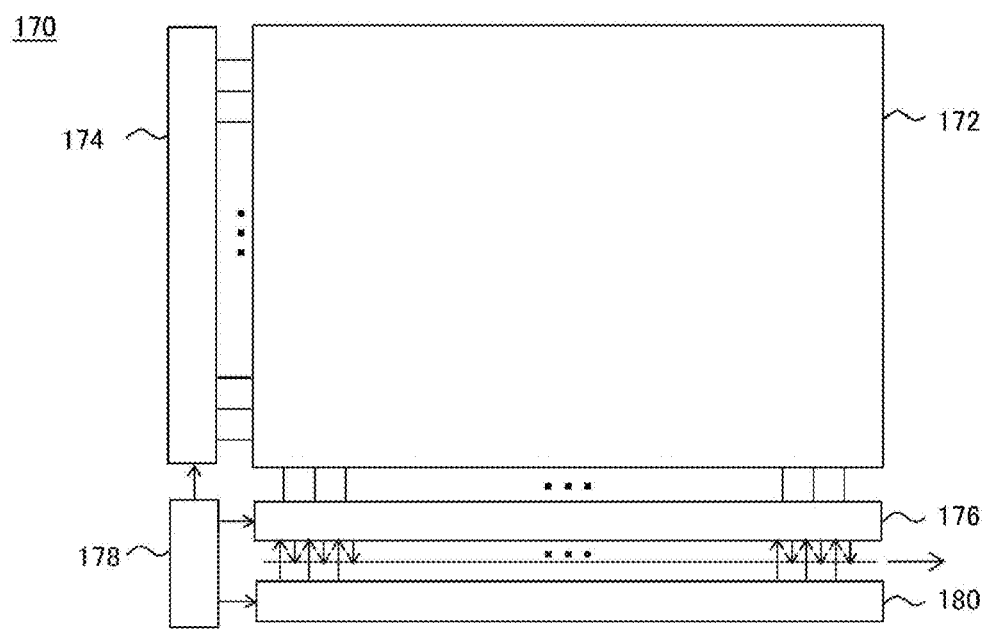
FIG. 4 is a diagram illustrating a schematic structure of an image sensor in the related technology.

FIG. 4 illustrates a schematic structure of an image sensor in the present embodiment. An image sensor 170 includes a pixel section 172 and a row scanning section 174, a horizontal selection section 176, a column scanning section 180, and a control section 178 as peripheral circuitry. The pixel section 172 includes pixels arranged in matrix pattern as illustrated in FIG. 2.

Each photodiode in the photoelectric conversion layer 118 is connected to the row scanning section 174 for each row and to the horizontal selection section 176 and the column scanning section 180 for each column. The row scanning section 174 includes shift registers, address decoders, and so on and drives the respective pixels on a row-by-row basis. A signal output from the pixel selected and scanned by the row scanning section 174 is supplied to the horizontal selection section 176. The horizontal selection section 176 includes amplifiers and horizontal selection switches.

The column scanning section 180 includes shift registers, address decoders, and so on and drives the respective horizontal selection switches of the horizontal selection section 176 in turn while at the same time operating these switches. Each of the signals from the respective pixels supplied to the horizontal selection section 176 as a result of selection and scanning by the column scanning section 180 is externally output. The control section 178 generates timing signals, controlling timings at which to drive the horizontal selection section 176, the column scanning section 180, and so on.

In a mode of the present embodiment, some pixels have a polarizer whereas other pixels do not have one. In this case, the pixels with a polarizer reflect part of incident light. As a result, the intensity of light that reaches the photodiodes is lower than in the pixels with no polarizer. Also, more information is acquired by the pixels with a polarizer than those with no polarizer. In consideration of all these factors, peripheral circuitry as that illustrated may be divided into two depending on whether there is a polarizer so that data readout timings and intervals between readouts can be controlled independently.

For example, the same level of luminance is achieved across the image plane by reducing a frame rate of the pixels including a polarizer and lengthening a charge accumulation time longer than for other pixels. This makes it possible to treat the image as a whole uniformly irrespective of whether a polarizer is provided. Alternatively, conversely to the above, the frame rate of the pixels including a polarizer may be increased. In this case, the sensitivity for detecting a motion of the subject's plane can be increased by using a luminance distribution of polarization output at a high rate and obtaining a normal vector distribution frequently. The manner in which data readout timings are to be controlled may be determined, for example, in accordance with the detection sensitivity required of processing content at subsequent stages.

Figure 5:
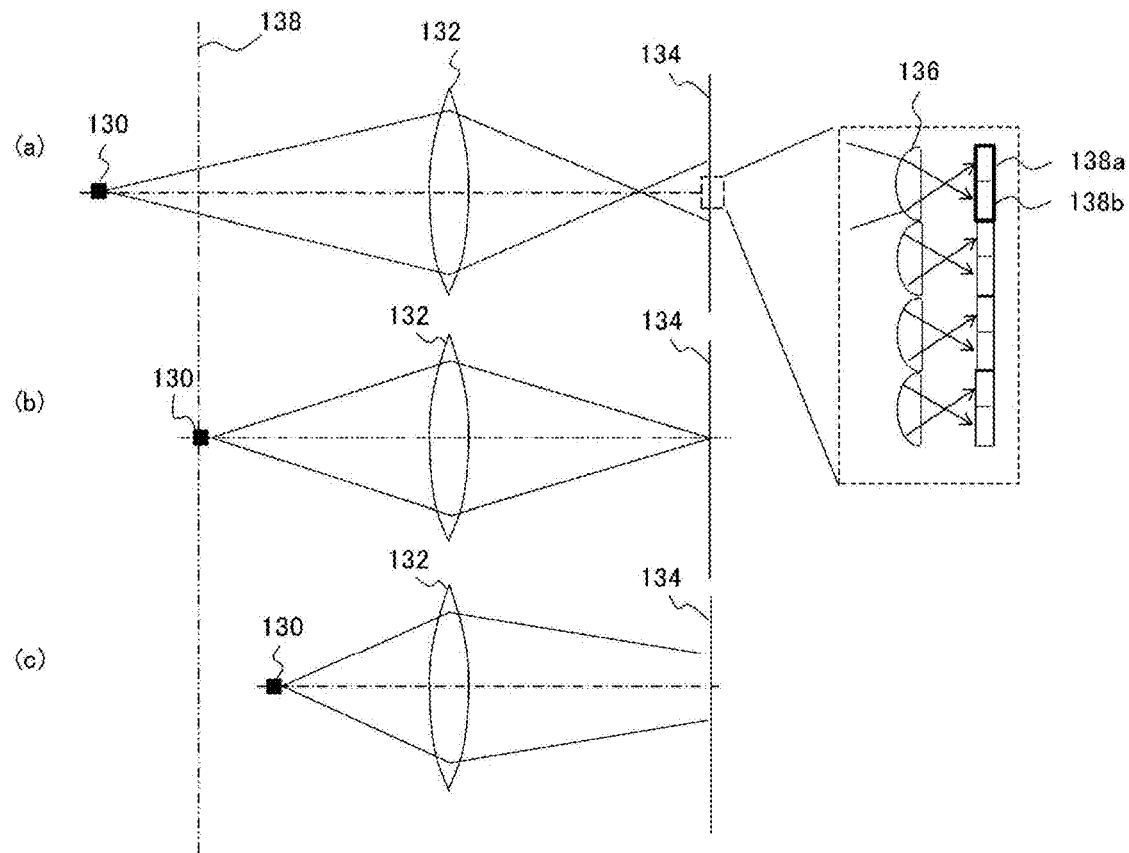
FIG. 5 depicts diagrams for describing a principle behind acquiring distance information through a phase difference in the related technology.

FIG. 5 depicts diagrams for describing a principle behind acquiring distance information through phase difference. These figures illustrate a route through which light from a subject 130 enters an imaging surface 134 of the imaging element 20 by way of a focusing lens 132 of the image forming optics 14 as viewed from above the imaging space. We assume that the distance from the imaging surface 134 to the subject 130 is different between states (a), (b), and (c) and that the subject 130 is located at an in-focus position, i.e., at a focused surface 138, in state (b).

That is, light emitted from a point on the subject 130 forms an image at one point on the imaging surface 134 in state (b). Therefore, a point on the subject corresponds to a pixel, and even if two photodiodes are provided in a pixel, a luminous flux detected by these photodiodes originates from approximately the same point on the subject 130. On the other hand, if the subject 130 is located at the back of the focused surface 138 as in state (a) or at the front of the focused surface 138 as in state (c), the position where light forms an image deviates from the imaging surface 134.

As a result, misalignment occurs in a pixel that captures a luminous flux depending on through which of two parts, left and right (top and bottom in FIG. 5), of the focusing lens 132 the luminous flux passes. As illustrated in an enlarged manner on the right in FIG. 5, of the light beams passing through the microlens 136, those light beams coming from an upper side in FIG. 5 are detected by a photodiode 138b at the bottom in FIG. 5 and those light beams coming from a lower side in FIG. 5 are detected by a photodiode 138a at the top in FIG. 5. In the description given below, of the photodiode pair, the photodiode on the left as viewed from the imaging surface (e.g., photodiode 138a) will be also referred to as a left photodiode, and the photodiode on the right as viewed from the imaging surface (e.g., photodiode 138b) will be also referred to as a right photodiode.

As a result, misalignment proportional to misalignment in pixels for capturing luminous flux occurs between the image acquired by extracting only the luminance detected by the left photodiode in each pixel and the image acquired by extracting only the luminance detected by the right photodiode in each pixel. The amount of misalignment in question depends on the distance between the subject 130 and the focused surface 138. Also, the direction of misalignment is reversed between when the subject 130 is closer to or farther from the imaging surface 134 than the focused surface 138. Hereinafter, two images having, as pixel values, luminances detected by the left and right photodiodes, respectively, will be referred to as "phase difference images," and the amount of misalignment in the silhouette of the same subject in the two images will be referred to as "phase difference."

Figure 6:
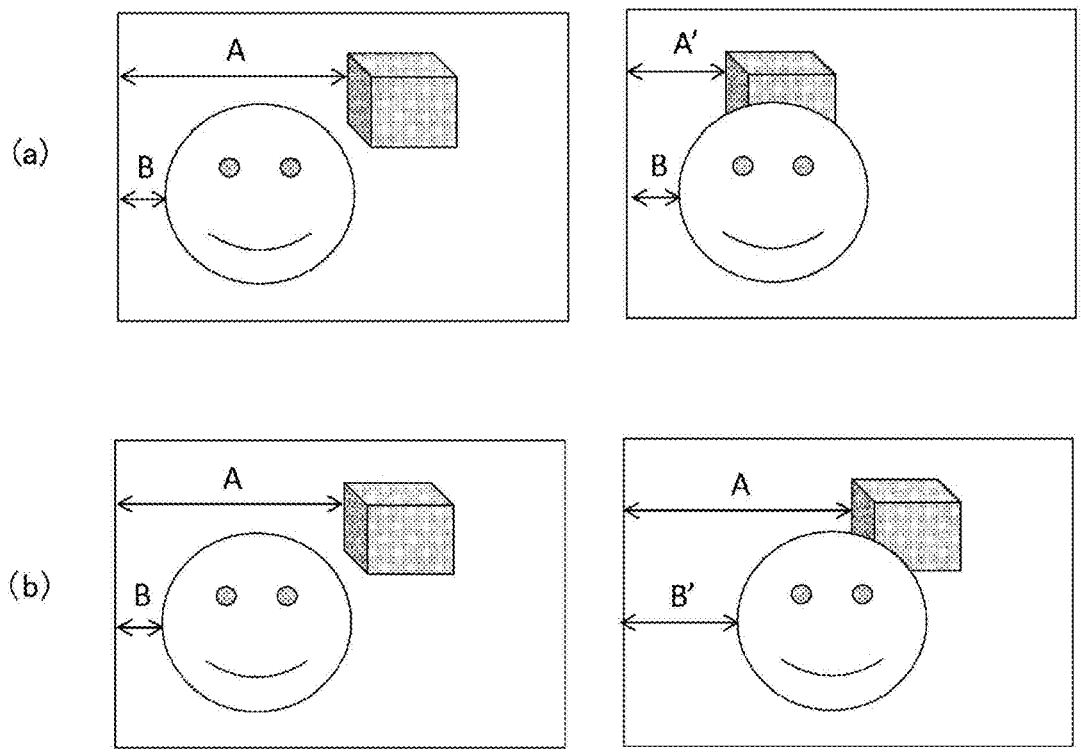
FIG. 6 depicts diagrams for describing a relationship between an acquired image and a focal distance in the related technology.

FIG. 6 depicts diagrams for describing a relationship between an image and a focal distance acquired in the present embodiment. These figures schematically illustrate phase difference images when a space in which a face and a cube exist is shot, and of the left and right images, the left ones have been detected by the left photodiode, and the right ones have been detected by the right photodiode. Of these, the face is in focus in the images (a). In this case, the silhouette of a face is located at a distance B from the left edge in both of the phase difference images, and as a result, no phase difference is present. On the other hand, a phase difference of (A'-A) is present in the silhouette of a cube. The cube is in focus in the images (b). In this case, the cube silhouette is located at a distance A from the left edge in both of the phase difference images, and as a result, no phase difference is present. On the other hand, a phase difference of B'-B is present in the face silhouette.

Figure 7:
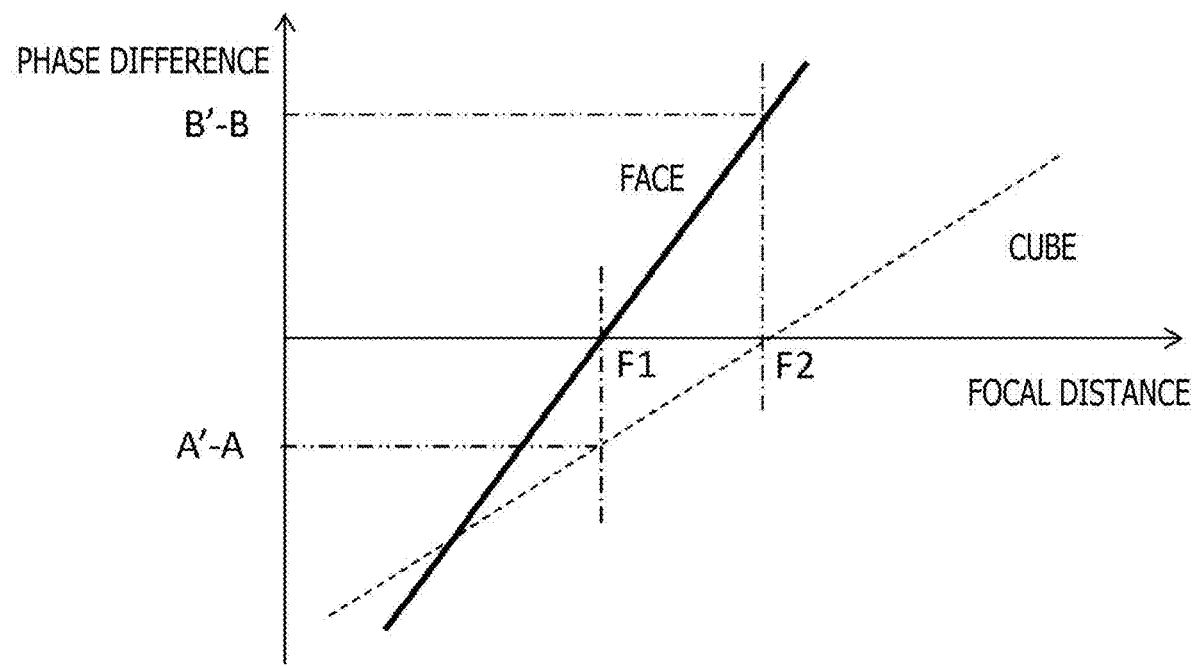
FIG. 7 is a diagram schematically illustrating a relationship between the focal distance and a phase difference in the case depicted in FIG. 6.

As described above, because the direction of misalignment is reversed between when the subject is closer or farther than the focal distance, phase difference can take on a negative value. FIG. 7 schematically illustrates a relationship between the focal distance and the phase difference in the case depicted in FIG. 6. The solid line and the broken line in the figure represent the phase difference in the face and the phase difference in the cube, respectively, as a change relative to the focal distance. It should be noted that the actual phase difference characteristic is not limited to that illustrated due to various factors related to optics. When the focal distance is F1, there is no phase difference in the face as illustrated in (a) of FIG. 6, and a phase difference of A'-A is present in the cube. When the focal distance is F2, there is no phase difference in the cube as illustrated in (b) of FIG. 6, and a phase difference of B'-B is present in the face.

That is, when the distance to the subject is fixed, the phase difference is uniquely determined by the focal distance. In other words, when the focal distance and the phase difference are determined, it is possible to identify the distance to the subject. The focal distance can be similarly acquired with a focusing function of an ordinary imaging apparatus. Also, as for the relationship between the distance from the focal distance (focused surface) to the subject and the phase difference, a relationship experimentally acquired from an actual shot image of the subject at a known distance is prepared in advance as a table. This makes it possible to calculate the distance from the imaging surface to the subject by obtaining the distance from the focused surface on the basis of the observed phase difference and further adding the focal distance.

A description will be given next of a technique for acquiring normal vectors from polarization images. Research has been conducted on technologies for acquiring various pieces of information regarding a subject by taking advantage of polarization component images in a plurality of directions. Methods of obtaining normal vectors of a subject surface is disclosed, for example, in Gary Atkinson and Edwin R. Hancock, "Recovery of Surface Orientation from Diffuse Polarization," IEEE Transactions on Image Processing, June 2006, 15(6), pp. 1653-1664, Japanese Patent Laid-Open No. 2009-58533, and so on, and these methods may be adopted in the present embodiment as appropriate. An outline will be given below.

First, the luminance of light observed via a polarizer changes with respect to a principal axis angle $\theta_{pol}$ of the polarizer as indicated by the following formula:

[Math. 1]

$$I = \frac{I_{max} + I_{min}}{2} + \frac{I_{max} - I_{min}}{2} \cos(2(\theta_{pol} - \varphi)) \quad \text{(Formula 1)}$$

Here, $I_{max}$ and $I_{min}$ are the maximum and minimum values of the luminance observed, respectively, and $\phi$ is the phase of polarization. In the case where polarization images are acquired for the four principal axis angles $\theta_{pol}$ as described above, the luminance I of the pixel at the same position satisfies Formula 1 for each of the principal axis angles $\theta_{pol}$. Therefore, $I_{max}$, $I_{min}$, and $\phi$ can be obtained by approximating curves passing through these coordinates (I, $\theta_{pol}$) to a cosine function by using the least squares method or other technique. A degree of polarization $\rho$ can be obtained with the following formula by using $I_{max}$ and $I_{min}$ obtained as described above.

[Math. 2]

$$\rho = \frac{I_{max} - I_{min}}{I_{max} + I_{min}} \quad \text{(Formula 2)}$$

A normal of a target surface can be expressed by an azimuth $\alpha$ that represents the angle of an incident surface of light (outgoing surface in the case of diffuse reflection) and a zenith angle $\theta$ that represents the angle on the surface in question. Also, according to a dichroic reflection model, reflected light spectra are represented by a linear sum of mirror reflection spectra and diffuse reflection spectra. Here, mirror reflection is light normally reflected by the surface of an object, and diffuse reflection is light scattered by pigment particles included in the object. The above azimuth $\alpha$ is the principal axis angle that gives the minimum luminance $I_{min}$ in Formula 1 in the case of mirror reflection and the principal axis angle that gives the maximum luminance $I_{max}$ in Formula 1 in the case of diffuse reflection.

The zenith angle $\theta$ has the following relationships with a degree of polarization $\rho_s$ in the case of mirror reflection and a degree of polarization $\rho_d$ in the case of diffuse reflection, respectively:

[Math. 3]

$$\rho_s = \frac{2\sin^2\theta\cos\theta\sqrt{n^2-\sin^2\theta}}{n^2-\sin^2\theta-n^2\sin^2\theta+2\sin^4\theta} \quad \text{(Formula 3)}$$

$$\rho_d = \frac{(n-1/n)^2\sin^2\theta}{2+2n^2-(n+1/n)^2\sin^2\theta+4\cos\theta\sqrt{n^2-\sin^2\theta}}$$

Here, n is the refractive index of the target. The zenith angle θ can be acquired by substituting the degree of polarization ρ acquired by Formula 2 into $\rho_s$ or $\rho_d$ in Formula 3. A normal vector ($p_x$, $p_y$, $p_z$) can be acquired by the azimuth α and the zenith angle θ as follows:

[Math. 4]

$$\begin{pmatrix} p_x \\ p_y \\ p_z \end{pmatrix} = \begin{pmatrix} \cos\alpha\cos\theta \\ \sin\alpha\cos\theta \\ \sin\theta \end{pmatrix} \quad \text{(Formula 4)}$$

As described above, the normal vector of the target appearing in the pixel in question is obtained from the relationship between the luminance I represented by each pixel of the polarization image and the principal axis angles $\theta_{pol}$ of the polarizer, thus providing a normal vector distribution as an entire silhouette. For example, in a mode where the target can be limited, for example, to a game controller, an appropriate model of the two models, mirror reflection and diffuse reflection models, is adopted, thus allowing a normal to be obtained with higher accuracy. On the other hand, a variety of techniques have been proposed to separate mirror reflection and diffuse reflection. Therefore, a normal may be obtained in a stricter manner by using such techniques.

Figure 8:
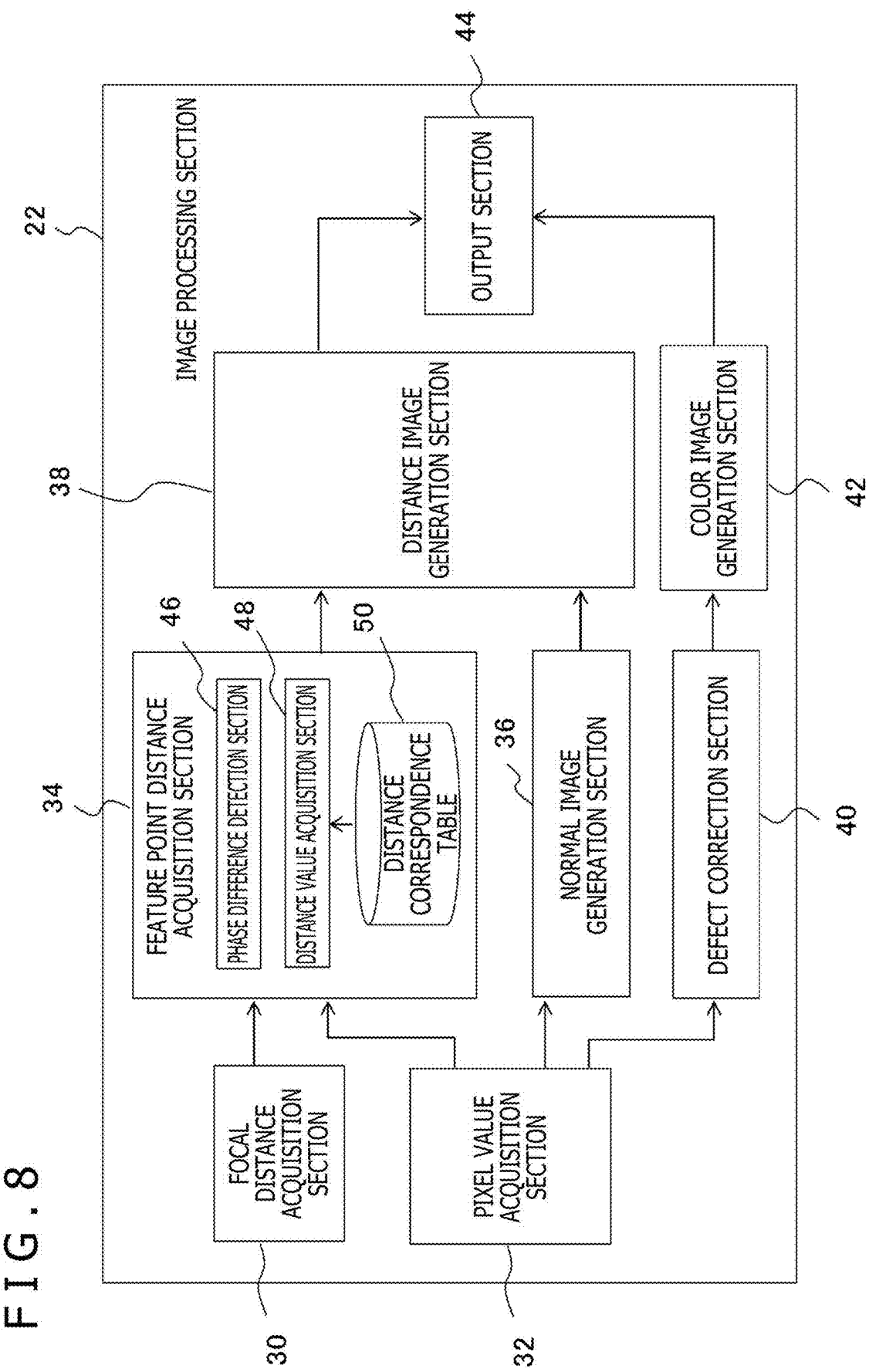
FIG. 8 is a diagram illustrating functional blocks of an image processing section in the related technology.

FIG. 8 illustrates functional blocks of the image processing section 22 in the present embodiment. Each of the functional blocks illustrated in this figure and FIGS. 17 and 20 described later can be realized, in terms of hardware, by a component such as an imaging element, various arithmetic circuits, a microprocessor, and a buffer memory, and in terms of software, by programs stored in a memory. Therefore, it is understood by those skilled in the art that these functional blocks can be realized in a various manners by hardware alone, software alone, or a combination thereof and are not limited to any one of them.

The image processing section 22 includes a pixel value acquisition section 32, a focal distance acquisition section 30, a feature point distance acquisition section 34, a normal image generation section 36, a distance image generation section 38, a defect correction section 40, a color image generation section 42, and an output section 44. The pixel value acquisition section 32 acquires 2D luminance data from the imaging element 20 and performs given preprocessing. The focal distance acquisition section 30 acquires an actual focal distance. The feature point distance acquisition section 34 generates a distance image on the basis of phase difference. The normal image generation section 36 generates a normal image from polarization luminance in a plurality of directions. The distance image generation section 38 generates a distance image by interpolating a distance value based on phase difference with a normal vector. The defect correction section 40 corrects a pixel value defect. The color image generation section 42 generates a color image by a demosaicing process. The output section 44 outputs distance image and color image data.

The pixel value acquisition section 32 acquires a luminance signal, detected by the imaging element 20, as 2D data and performs given preprocessing such as A/D (Analog-to-Digital) conversion and clamping process. The focal distance acquisition section 30 reads out a focal distance, acquired by the focusing function or other function incorporated in the imaging apparatus 2, a function not illustrated, from the memory. In an environment where the focal distance is adjustable, each time the focal distance changes, the data is read out. In the apparatus where the focal distance is fixed, the setting thereof is acquired initially.

The feature point distance acquisition section 34 includes a phase difference detection section 46, a distance value acquisition section 48, and a distance correspondence table 50. The phase difference detection section 46 generates a phase difference image by separating, of the pixel values acquired by the pixel value acquisition section 32, those pixel values detected by the left and right photodiodes. At this time, all the pixels in Bayer pattern may be treated as target pixels. Alternatively, only the green pixels may be treated as target pixels. Then, feature points of the two are extracted, and a phase difference is obtained for each feature point by identifying a position representing the same feature point in the subject.

The distance correspondence table 50 stores a distance correspondence table associating the distance from the focused surface with the phase difference. The distance value acquisition section 48 acquires the distance value corresponding to the phase difference by referring to the distance correspondence table on the basis of the phase difference acquired by the phase difference detection section 46. Then, the distance value acquisition section 48 acquires the absolute value of the distance from the imaging surface for each feature point by adding the distance value to the focal distance acquired from the focal distance acquisition section 30.

The normal image generation section 36 acquires, of the pixel values acquired by the pixel value acquisition section 32, the values of the pixels having a polarizer, and further, generates polarization images in a plurality of directions by separating and interpolating the pixel values for each principal axis angle. At this time, the detection values of the two photodiodes provided in one pixel are summed up for use as a single pixel value. Also, polarization luminances in a plurality of directions are acquired for the same position on the image plane by interpolating the polarization luminance in each direction. Then, a normal vector is calculated by using Formulas 1 to 4 on the basis of a change of the polarization luminance relative to the direction.

The normal image generation section 36 generates a normal image having three factors of normal vector acquired for each pixel. This image can basically have the same resolution as a shot image. On the other hand, a normal image may be generated with a lower resolution than the shot image depending on resolution required of the normal vector and the distance image at subsequent stages.

The distance image generation section 38 generates a distance image representing distances on the subject surface as pixel values by interpolating the distance values for the feature points generated by the feature point distance acquisition section 34 by using the normal images generated by the normal image generation section 36. That is, although capable of acquiring distance values for easy-to-identify feature points, which may obtain the phase difference, such as silhouette outlines and surface patterns, the feature point distance acquisition section 34 has difficulty in calculating the distance of a region whose feature points are difficult to be readily extracted such as surface of a monochromatic and smooth object.

On the other hand, the normal image generation section 36 can acquire, in a detailed manner, an inclination of an object surface for each minute region. Therefore, it is possible to obtain a distance with a similar resolution to that with which a normal vector was acquired by using the distance values at the feature points acquired by the feature point distance acquisition section 34 as starting points and giving, in turn, an inclination based on the normal vector acquired by the normal image generation section 36. The defect correction section 40 corrects, of the pixel values acquired by the pixel value acquisition section 32, those pixel values of the pixels with a polarizer.

The pixels with a polarizer reflect polarization components in the same direction as the principal axis angle of the polarizer. Therefore, light reaching the photodiodes is lower in intensity than light incident on the imaging surface. Therefore, the luminances of the pixels in question are corrected in such a manner as to provide luminance levels comparable to those of the surrounding pixels, thus preventing some pixels of a color image from becoming black dots. As a correction process, the pixel luminances may be interpolated with surrounding pixel values. Alternatively, the percentage of decline in amount of light attributable to the polarizer may be obtained, for example, experimentally in advance so that the appropriate pixel value is multiplied by a constant based on the percentage of decline. It should be noted that the defect correction section 40 also sums up the detection values of a pair of photodiodes and treats the values as a single pixel value.

The color image generation section 42 generates a color image each of whose pixels has three attributes of color by performing a demosaicing process on the image that has undergone the defect correction. That is, the color image generation section 42 ensures that all pixels have three attributes by interpolating, on a color-by-color basis, the pixel values acquired in Bayer pattern as illustrated in FIG. 3. An ordinary demosaicing technique can be used for this process. The output section 44 acquires at least distance image data generated by the distance image generation section 38 and color image data generated by the color image generation section 42 and sequentially outputs these pieces of data to an external apparatus.

Alternatively, the output section 44 may temporarily store these pieces of data in a memory or a recording medium so that the data can be sent to an external apparatus at a proper timing, for example, in response to user operation or be taken out by the user. In the present embodiment, color and distance images can be acquired at the same time with comparable resolutions, thus allowing for various kinds of information processing to be performed with accuracy by using these images. For example, the position and color of a subject in a 3D space are found. Therefore, by arranging these temporarily in a virtual space, it is possible to reconstruct a display image to match with the viewpoint of the user wearing a head-mounted display. At this time, virtual reality and enhanced reality can be realized by generating an image for left viewpoint and another image for right viewpoint and displaying the images respectively in left and right regions obtained by dividing the display screen of the head-mounted display into two parts.

It should be noted that the output section 44 may further output the normal image generated by the normal image generation section 36. Normal information can be used for motion detection because this information represents the change in subject's posture with higher sensitivity than the subject's silhouette itself. It should be noted that if the image processing section 22 of the imaging apparatus 12 can generate a distance image together with a color image as illustrated, it is possible to keep, to a minimum, burdens on an information processing apparatus that uses such images for performing various processes and keep, to a minimum, power consumption of the information processing apparatus.

On the other hand, at least one of the distance image generation section 38, the feature point distance acquisition section 34, and the normal image generation section 36 may be provided in an information processing apparatus other than the imaging apparatus 12. Alternatively, a logic circuit having at least some of the functions of those as illustrated may be provided in the underlying layer of the pixel arrangement to provide a stacked image sensor. As a result, many image processing tasks are completed within the image sensor, thus speeding up processing and eliminating the need for a large-scale arithmetic unit.

Figure 9:
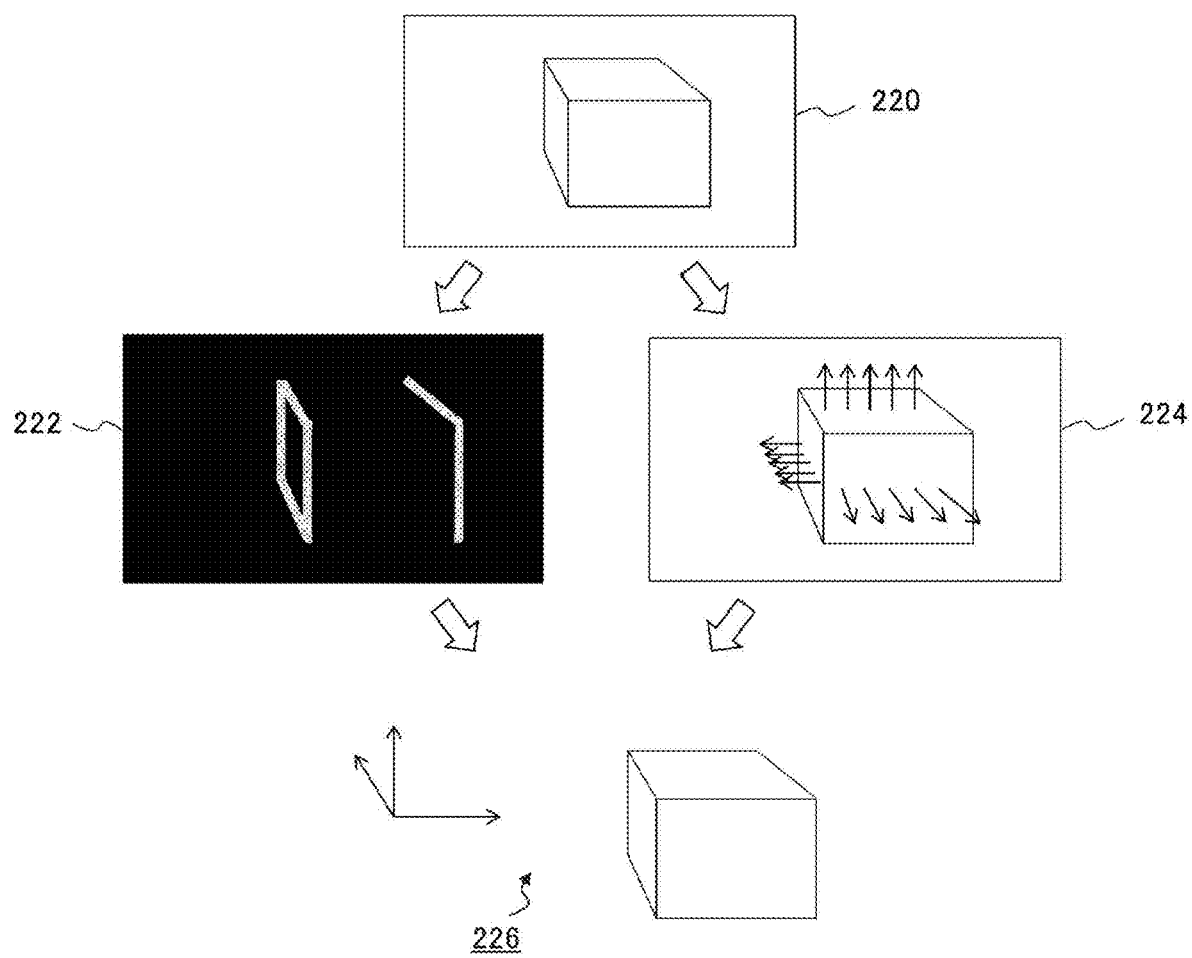
FIG. 9 is a diagram schematically illustrating changes made to a shot image by the image processing section in the related technology.

FIG. 9 schematically illustrates changes made to a shot image by the image processing section 22. First, the pixel value acquisition section 32 acquires shot image data like an image 220. In the example illustrated, a cube appears as a subject. Acquired data, to be precise, includes information regarding luminance of natural light or polarization detected by the left and right photodiodes. The feature point distance acquisition section 34 acquires phase differences of the feature points as described above and uses the phase differences and focal distances to generate data 222 of distance values to the feature points.

The data 222 illustrated is represented in distance image format in which the smaller the distance value, the higher the luminance and in which the lowest luminance is assigned to locations with no distance value. In this case, of the cube, a subject, edge portions with a high luminance gradient can be extracted as feature points, and further, a distance value can be acquired only for those portions whose phase difference is obtained in the phase difference image. If a pair of photodiodes are arranged, one on the left and another on the right, in a pixel region as illustrated in FIG. 3, phase differences manifest themselves in the horizontal direction of the image plane. This makes it impossible to identify phase differences accurately for horizontal edges as illustrated in the data 222, thus resulting in undefined distance values.

On the other hand, the normal image generation section 36 generates a normal image 224 by using polarization images in a plurality of directions. Although only part of a normal vector distribution on the cube surface is illustrated by arrows, normal vectors can be actually obtained on a pixel-by-pixel basis. The distance image generation section 38 applies, on a pixel-by-pixel basis, a surface inclination based on a normal vector by using the edge portion distances acquired by the phase-difference-based distance value data 222 as starting points. As a result, not only the fact that a flat surface is present between the edges in the data 222 but also distance values of the surface including the horizontal edge portions are found.

This makes it possible to acquire position information 226 in a world coordinate system for visible portions of a cube surface as a shot image. The distance image generation section 38 may generate information regarding position coordinates on the subject surface in such a 3D space or generate a distance image representing distance values on the image plane.

Figure 10:
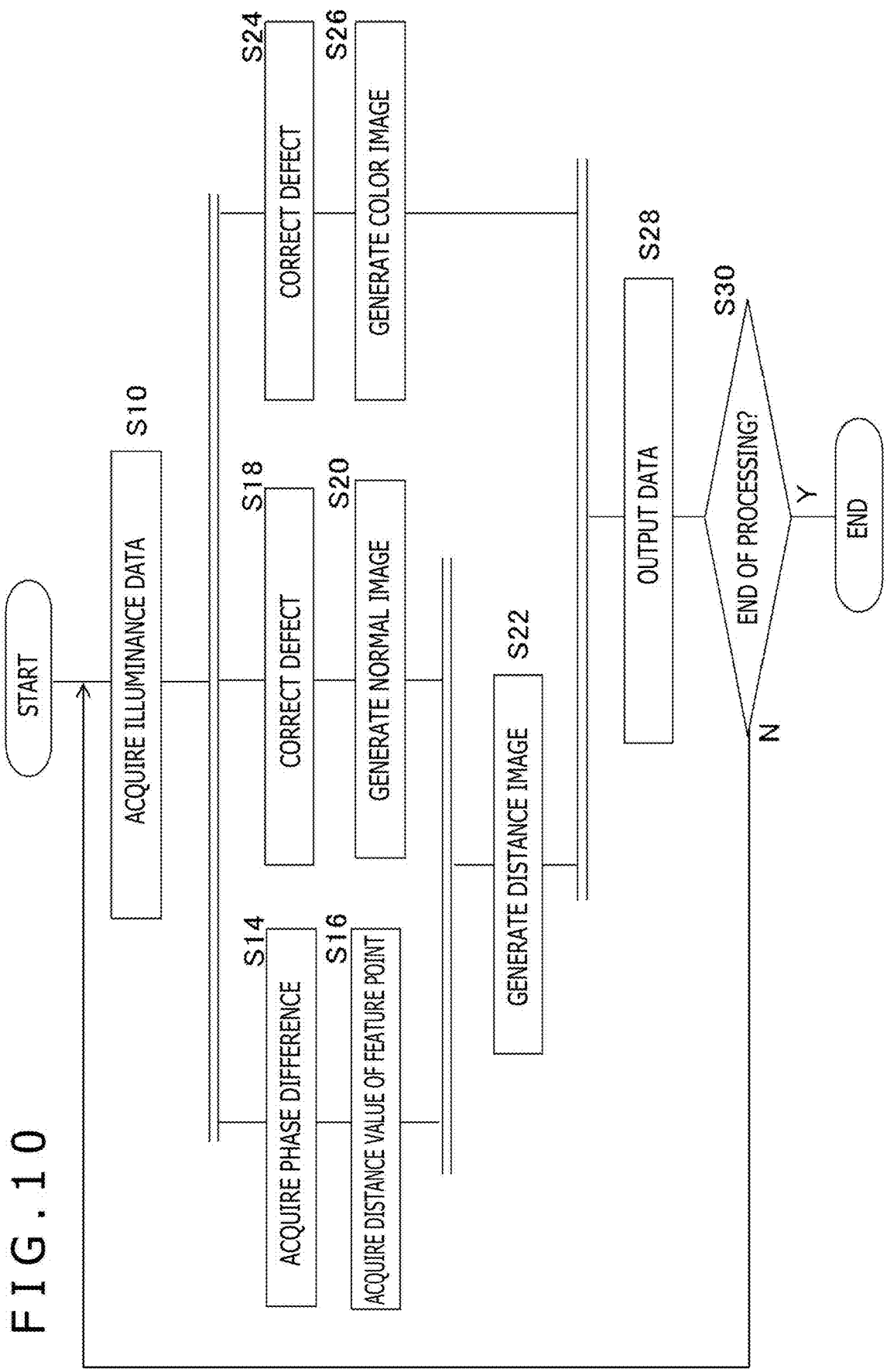
FIG. 10 is a flowchart illustrating a processing procedure for the image processing section to generate various pieces of data from a shot image and outputting the data in the related technology.

A description will be given next of operation of the image processing section 22 that can be realized by the components described so far. FIG. 10 is a flowchart illustrating a processing procedure for the image processing section 22 to generate various pieces of data from a shot image and outputting the data. First, the pixel value acquisition section 32 acquires luminance data detected by each of the photodiodes from the imaging element 20 (S10). The acquired luminance data is supplied to the feature point distance acquisition section 34, the normal image generation section 36, and the defect correction section 40.

The feature point distance acquisition section 34 generates a phase difference image by separating the luminances detected by the left and right photodiodes and acquires a phase difference by achieving correspondence between feature points (S14). Then, the feature point distance acquisition section 34 identifies a distance value for pixels included in the feature points on the basis of the phase difference and the focal distance (S16). The normal image generation section 36 generates polarization images in a plurality of directions by extracting the values of the pixels detecting polarization and separating and interpolating the pixel values for each principal axis angle of the polarizer (S18). Then, the normal image generation section 36 calculates a normal vector for each pixel or for each larger unit by acquiring direction dependence of polarization luminance at the same position and generates the normal image (S20).

The distance image generation section 38 generates a distance image whose distance value has been interpolated by obtaining a distance value using the normal image for locations whose distance value cannot be obtained through phase difference (S22). On the other hand, the defect correction section 40 performs defect correction that amplifies the luminance levels of the pixels detecting polarizations to the same level as other pixels (S24). The color image generation section 42 generates a color image by performing a demosaicing process on the corrected image in Bayer pattern (S26).

The output section 44 sequentially outputs the color image and distance image data to an external apparatus, a memory, or other location (S28). At this time, normal image data may also be output at the same time. The data to be output may be switched in response to a request from the output destination apparatus. If there is no need to terminate the shooting or data output through user operation, the processes from S10 to S28 are repeated on an image-frame-by-image-frame basis (N in S30). If there is a need to terminate the process, all the processes are terminated (Y in S30).

It should be noted that when the distance image generation section 38 generates a distance image in S22, distance images generated for a plurality (given number) of image frames may be accumulated so that data obtained by averaging the accumulated distance images is used as a distance image at that point in time and output at time intervals corresponding to the number of image frames in question. This contributes to a reduced ratio of noise component included in the distance image generated from one image frame, thus allowing for output of a highly accurate distance image. As for the number of frames of a distance image to be accumulated, an optimal number is obtained in advance experimentally or by other means in consideration of required accuracy, time resolution, and other factors. Alternatively, the number of frames may be changed adaptively in accordance with the luminance level of an actual shot image.

Figure 11:
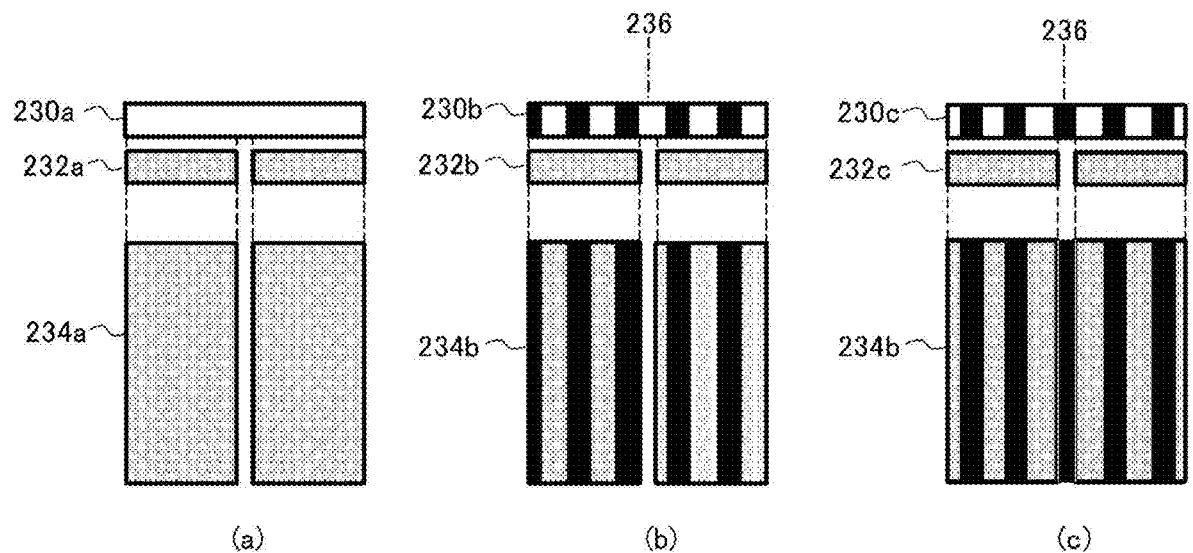
FIG. 11 depicts diagrams for describing a positional relationship between polarizers and photodiodes in the related technology.

The imaging element of the present embodiment includes a structure in which a polarizer is provided in an overlying layer of a pair of photodiodes. The detection of comparable luminance levels with a pairs of photodiodes is a precondition to obtaining a phase difference with accuracy. However, that balance may be lost depending on the positional relationship between the polarizer and the photodiodes. FIG. 11 depicts diagrams for describing a positional relationship between polarizers and photodiodes. These figures illustrate cross sections of stacked structures of polarizer layers 230a, 230b, and 230c and photodiode pairs 232a, 232b, and 232c and positional relationships 234a, 234b, and 234c thereof as viewed from above.

First, in the case of a pixel with no polarizer in the polarizer layer 230a as illustrated in (a), incident light reaches the photodiodes with no loss. Therefore, the luminance levels detected by the photodiode pair are comparable. In the pixels with a polarizer in the polarizer layers 230b and 230c as illustrated in (b) and (c), light that successfully reaches the photodiodes is approximately half the incident light due to reflection by the polarizer wires. When a color image is generated by using the sum of the detection values of the two photodiodes as a pixel value, it is possible to achieve a luminance level comparable to that of the surrounding pixels by multiplication by a given value or interpolation with detection values of the surrounding pixels.

On the other hand, if a polarizer wire arrangement is asymmetrical with respect to a vertical centerline 236 of the pixels as illustrated in (b), the areas coated with wires facing the photodiode pair 232b are different in size. This results in a difference in detection sensitivity between the pair of photodiodes. If a phase difference image is generated that includes such pixels, there is a possibility that a phase difference may not be detected with accuracy. Evening out levels by multiplying the detection value of the photodiode with lower sensitivity by a given value based on the wire area ratio would be a possible option. However, noise is also amplified. As a result, the phase difference accuracy may not always improve.

Figure 12:
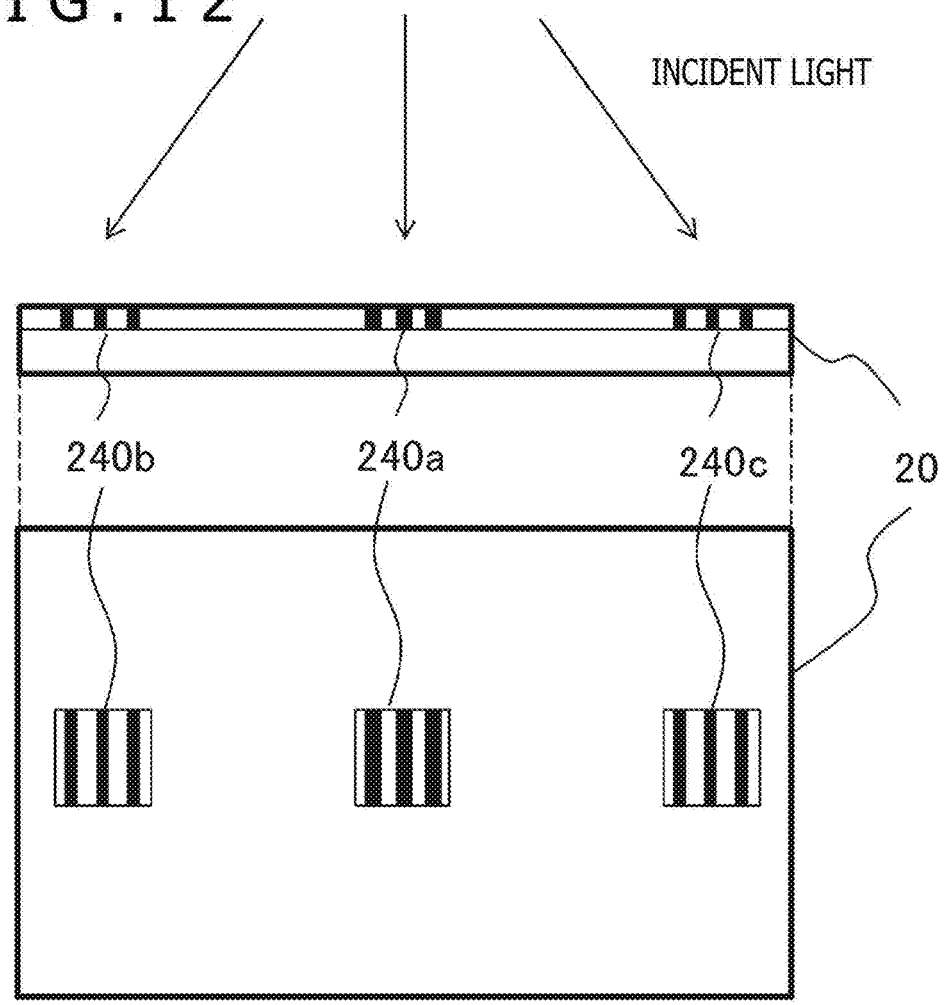
FIG. 12 is a diagram schematically illustrating a polarizer wire arrangement at different positions on an imaging surface in the related technology.

Therefore, it is desirable to arrange polarizer wires in a symmetrical manner with respect to the vertical centerline 236 of the pixels as illustrated in (c). This contributes to reduced impact of the polarizer on the luminance level detected by the photodiodes in one pixel. The difference in light detection sensitivity caused by the polarizer also takes place due to pixel positions across the imaging element 20. FIG. 12 schematically illustrates a polarizer wire arrangement at different positions on the imaging surface.

As illustrated in the side view at the top, light is incident approximately perpendicularly in a pixel 240a near the center of the imaging element 20. On the other hand, the larger the distance from the center, the larger the incident angle (chief ray angle (CRA)). For this reason, the farther the portions are from the center, the greater the effective shielding effect of the polarizer wires, thus making it less likely for light to enter into these portions and deteriorating the detection sensitivity as compared to the central portions. This results, in addition to the above balance in luminance level of the phase difference image, in a distribution across the plane in a color image generated by correcting a normal image using polarization and correcting the polarization luminance.

Preferably, therefore, the detection sensitivities of the photodiodes are evened out by varying the polarizer shape depending on the position on the imaging element 20. In the example illustrated, the loss of incident light is reduced by reducing widths of the wires of the polarizers of the pixels 240b and 240c in the surrounding portions as compared to that of the wires of the pixel 240a in the central portions. Actually, the wire width is gradually reduced with distance from the center portion. Alternatively, the wire height may be reduced or both the wire width and height may be changed with distance from the center.

Alternatively, the wire arrangement as a whole may be moved only minutely in a linearly symmetrical manner with respect to the centerline. For example, the entire wire arrangement of the pixel 240b at left on the imaging element 20 is moved to the left, and the entire wire arrangement of the pixel 240c at right on the imaging element 20 is moved to the right. This also provides a larger amount of incident light with angle. The wire width, height, and amount of movement of the wire arrangement are optimized to provide a minimum distribution across the plane in an actual shot image. At this time, the difference in sensitivity between the pair of photodiodes is minimized as described in FIG. 11.

Figure 13:
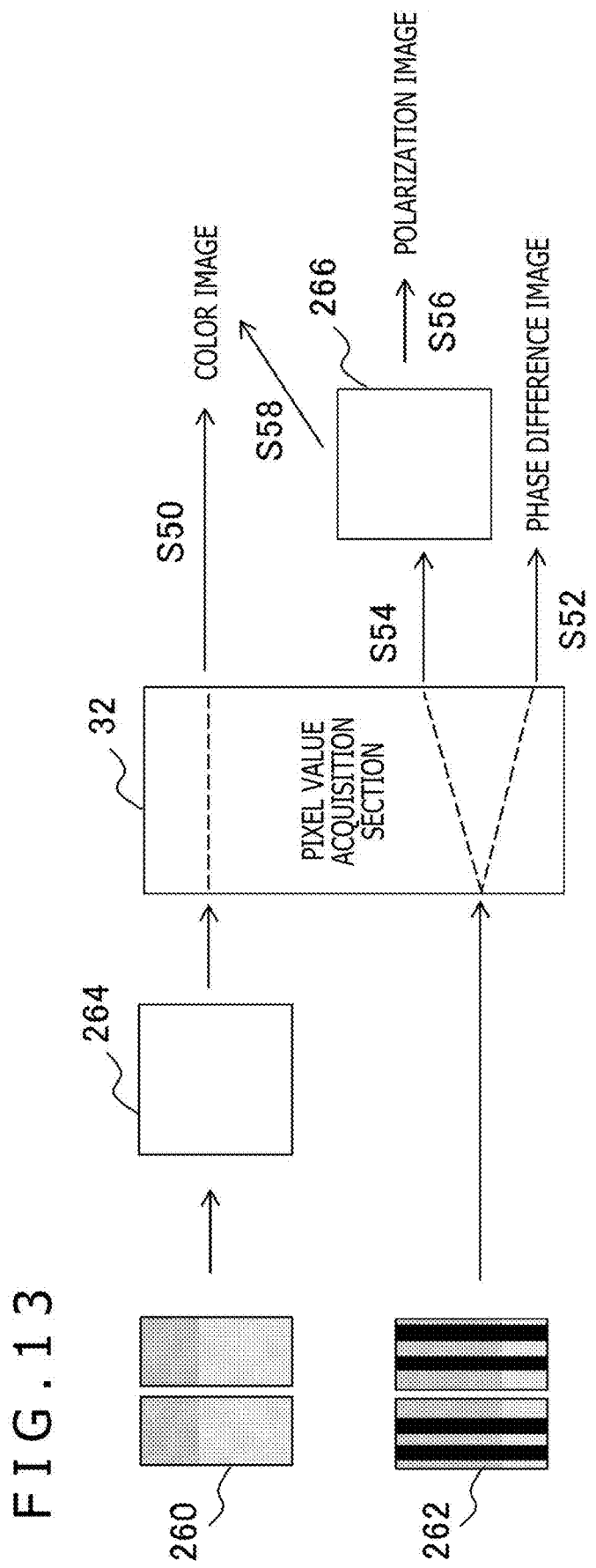
FIG. 13 is a diagram for describing data units and routes through which to generate various pieces of information in the case where units in which data is to be read out is varied depending on whether a polarizer is provided in the related technology.
Figure 14:
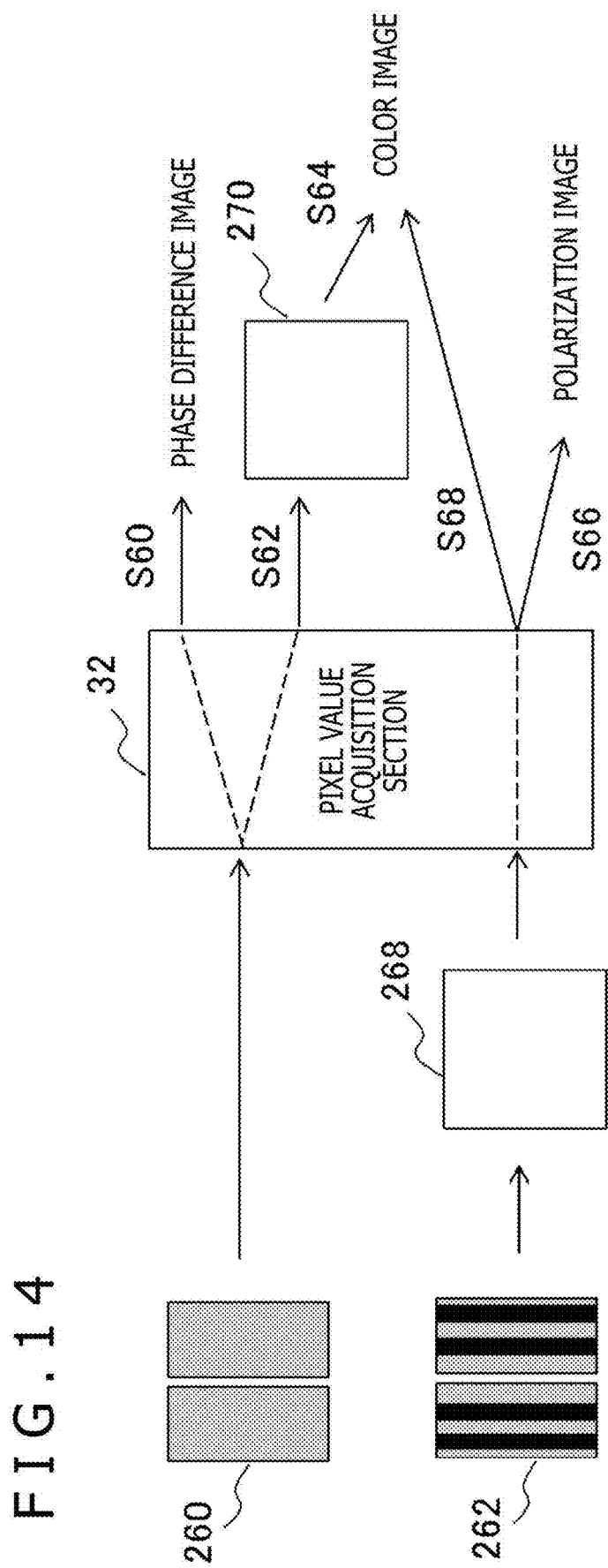
FIG. 14 is a diagram for describing data units and routes through which to generate various pieces of information in the case where units in which data is to be read out is varied depending on whether a polarizer is provided in the related technology.

In the modes described so far, the detection values of all the photodiodes are read out individually for extraction of necessary data and interpolation by the image processing section 22. In this case, constraints may arise on the frame rate due to a large amount of time required for data readout as a result of comparison with ordinary pixel values. For this reason, a possible option would be to change the units in which data is to be read out depending on whether a polarizer is provided so as to reduce the time required for readout. FIGS. 13 and 14 are diagrams for describing data units and routes through which to generate various pieces of information in the case where the units in which data is to be read out is varied depending on whether a polarizer is provided.

In the case illustrated in FIG. 13, the detection values of the two photodiodes are summed up for a pixel 260 with no polarizer, and the detection value is read out as a pixel-by-pixel value 264. As for a pixel 262 with a polarizer, on the other hand, each of the detection values of the two photodiodes is read out. These pieces of data are supplied to each functional block via the pixel value acquisition section 32. The sum of the detection values for the pixel 260 with no polarizer can be used in an 'as-is' manner to generate a color image (S50).

The value detected by each of the two photodiodes for the pixel 262 with a polarizer is used to generate a phase difference image (S52). Also, by summing up the detection values in this stage as a pixel-by-pixel value 266 (S54), the pixel-by-pixel value 266 is used to generate a polarization image and determine a color value of the pixel in question in a color image (S56 and S58). In this case, polarization information and phase difference information are acquired only from the pixels with a polarizer. In an environment where the ratio of the pixels 262 with a polarizer is low and where illuminance is relatively high, taking routes as illustrated in the figure ensures reduced readout time while at the same time maintaining a certain level of accuracy, thus achieving speedup.

In the case illustrated in FIG. 14, each of the detection values of the two photodiodes is read out for the pixel 260 with no polarizer. On the other hand, the detection values of the two photodiodes are summed up for the pixel 262 with a polarizer, and the detection value is read out as a pixel-by-pixel value 268. These pieces of data are supplied to each functional block via the pixel value acquisition section 32. The value detected by each of the two photodiodes for the pixel 260 with no polarizer is used to generate a phase difference image (S60). Also, the detection values are summed up in this stage for use as a pixel-by-pixel value 270 (S62) and is used to generate a color image (S64).

The detection value obtained through summation for the pixel 262 with a polarizer is used in an 'as-is' manner to generate a polarization image or determine a color value of the pixel in question in a color image (S66 and S68). In this case, phase difference information is acquired from pixels other than those with a polarizer. In this case, the sensitivity of phase difference information can be enhanced through comparison with the case illustrated in FIG. 13, thus making it possible to maintain the accuracy constant even in the environment where the illuminance is low. As described above, changing the units in which data is to be read out depending on whether a polarizer is provided ensures reduced readout time while at the same time acquiring necessary information.

It should be noted that the processes illustrated in FIGS. 13 and 14 need not be performed depending on types of information, accuracy, and resolution required. For example, the values of the pixels with a polarizer may not be used to generate a color image, and the values of the surrounding pixels with no polarizer may be interpolated. Also, the units in which data is to be read out and the route for generating data may be optimized in accordance with the accuracy and resolution required for various pieces of data, the surrounding lighting environment, and processing time limitation, and so on. The illuminance or the communication environment for data transmission may be measured, thus switching the units in which to read out data and the route for generating data in accordance with measurement results.

Figure 15:
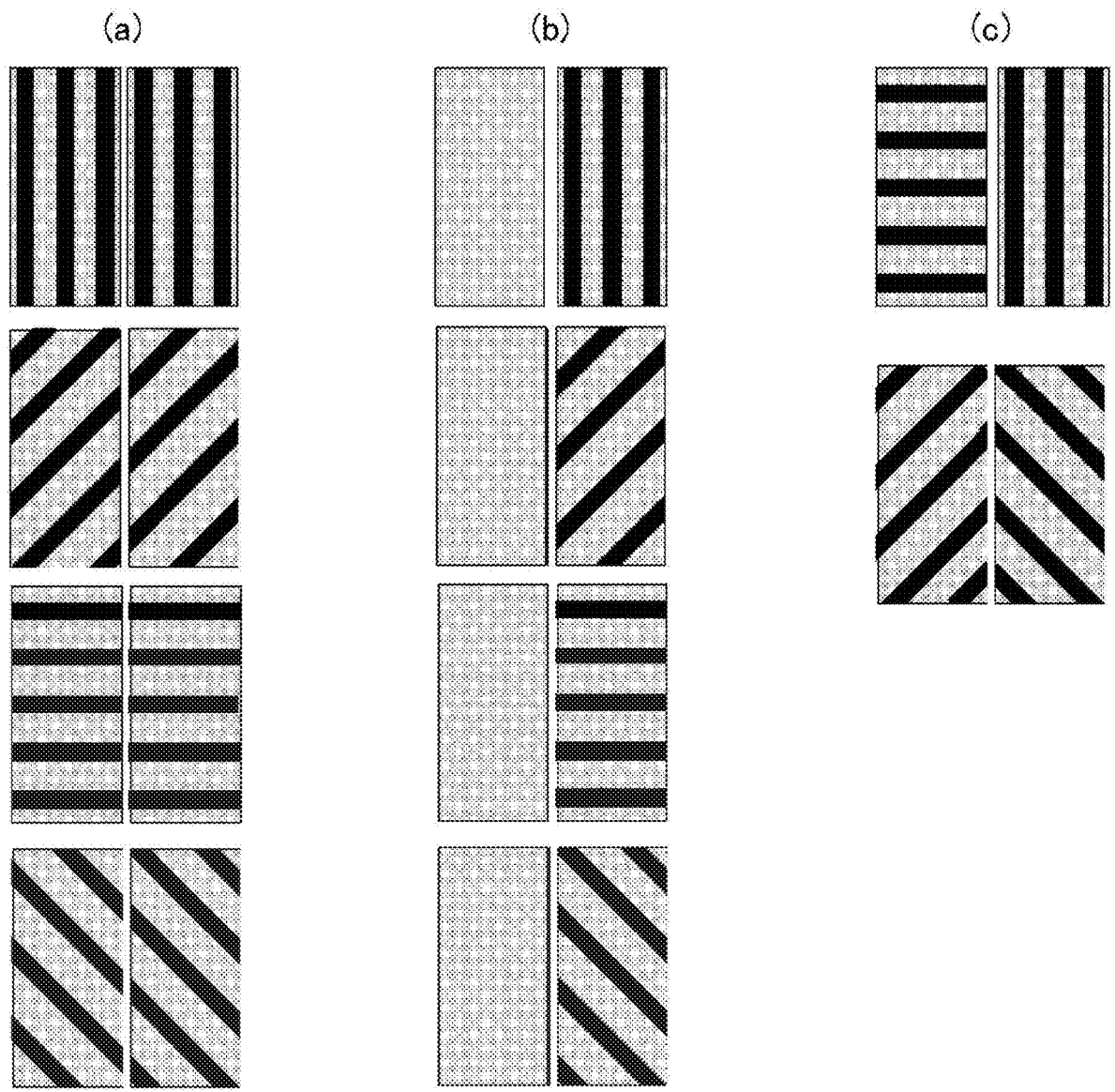
FIG. 15 depicts diagrams illustrating polarizer variations in terms of values of pixels with a polarizer in the related technology.

FIG. 15 illustrates polarizer variations in terms of the values of pixels with a polarizer. First, four types of pixels illustrated in (a) have a polarizer with a single principal axis angle for each pixel as has been described so far. Then, changing the principal axis angle every 45 degrees provides the four types of pixels as illustrated in the figure. These pixels are arranged at equal intervals or close to each other in the imaging element 20. If the pixels with a polarizer are dispersed, the pixels with a lower luminance level due to reflection are also dispersed. Therefore, in the case where a phase difference image or a color image is generated by using the pixels with no polarizer, it is possible to fill holes with high accuracy through interpolation.

On the other hand, if the four types of pixels as illustrated in the figure are arranged close to each other such as four pixels in two rows by two columns, it is possible to acquire the change in polarization luminance due to direction approximately at the same position with accuracy, thus ensuring enhanced accuracy in normal vector. The four types of pixels illustrated in (b) have a polarizer only in the region corresponding to one of the pair of photodiodes. In this case, it is possible to acquire the luminance with no polarizer from the other photodiode in the same pixel region, thus allowing for amplification of the luminance level that has declined due to the polarizer with accuracy.

Such an arrangement also allows for acquisition of phase difference with relative accuracy. A possible option, therefore, would be to include the pixels as illustrated in (b) in the imaging element 20 as a whole. Also, the pixels illustrated in (c) have a polarizer with a different principal axis angle in each of the regions corresponding to the photodiode pair. In the example illustrated, two types of pixels are illustrated that have a pair of polarizers whose principal axis angles differ by 90 degrees.

The process of acquiring a distance value from a phase difference basically compares detection value distributions of the left and right photodiodes. On the other hand, the process of acquiring a normal vector from polarization information includes a process of comparing detection values of light that has passed through the polarizers having different principal axis angles. For this reason, if polarizers as illustrated in (c) are used, the process of acquiring a phase difference and the process of acquiring a normal can be commonized in terms of comparison between the detection values of the left and right photodiodes, thus simplifying a drive circuit.

Figure 16:
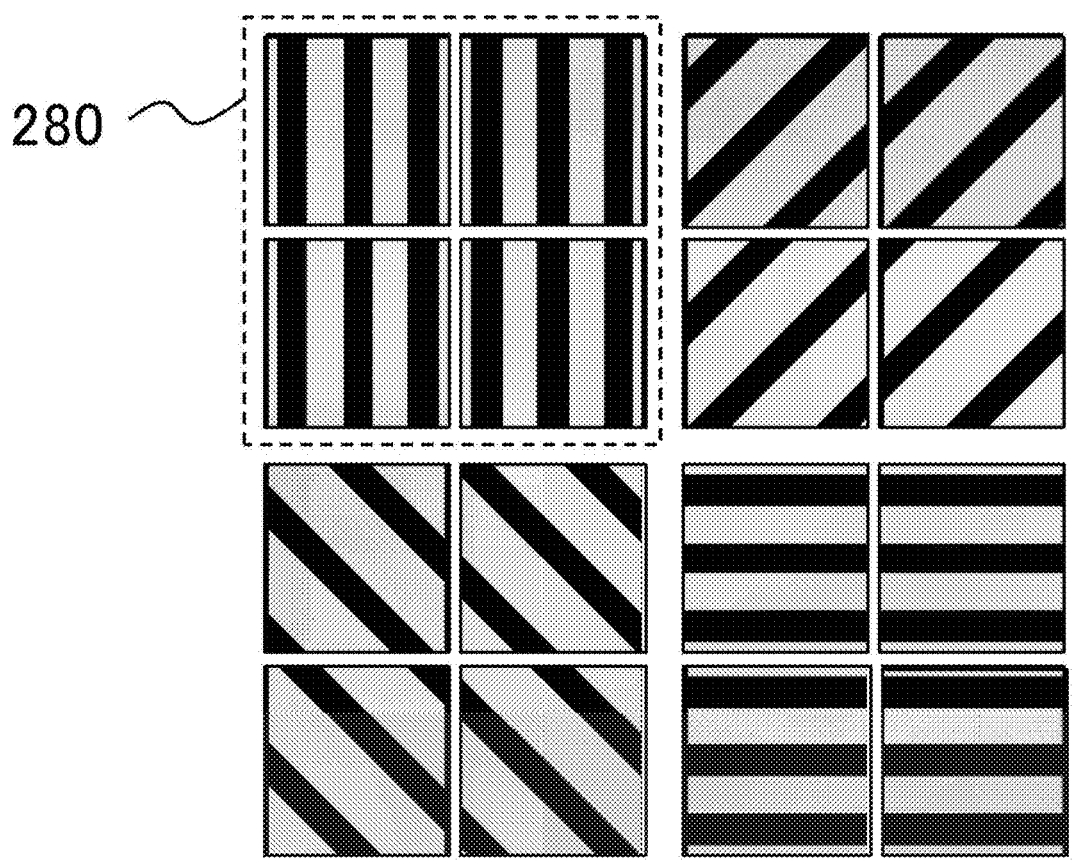
FIG. 16 is a diagram illustrating variations of photodiodes provided in a pixel in the related technology.

FIG. 16 illustrates variations of photodiodes provided in a pixel. In the examples described so far, a photodiode was provided in each of the left and right regions obtained by vertically dividing the pixel region into two parts. In this case, phase differences manifest themselves only in the horizontal direction of the image plane. As a result, as described with reference to FIG. 9, the phase difference is undefined for some of the feature points such as horizontal edges, thus making it impossible to acquire a distance value. For this reason, a photodiode may be arranged in each of four regions obtained by dividing a single pixel (e.g., pixel 280) vertically and horizontally respectively into two parts as illustrated in the figure.

In this case, summing up the detection values of the two vertically adjacent photodiodes provides the same phase difference image as with the left and right photodiodes described so far, thus allowing for acquisition of a phase difference between horizontal components. On the other hand, summing up the detection values of the two horizontally adjacent photodiodes provides phase difference images between the upper and lower photodiodes, thus allowing for acquisition of a phase difference between vertical components. As a result, it is possible to acquire a distance value regardless of the feature point direction.

Although a polarizer having a single principal axis angle is provided in each pixel in the examples illustrated, the principal axis angle of the polarizer may be varied or whether a polarizer is provided may be controlled on a photodiode-by-photodiode basis as illustrated in FIG. 15. Also, a photodiode may be arranged in each of four regions obtained by a similar division for the pixels with no polarizer. Such pixels with a polarizer and with no polarizer may be arranged periodically.

Also, color filters of the same color may be used within a pixel. Alternatively, the color may be changed from one photodiode to another. In addition to the above, a photodiode may be provided in each of two regions, upper and lower regions, obtained by dividing the pixel region horizontally. Alternatively, the pixel region may be divided into smaller parts than two rows by two columns so that a photodiode is arranged in each region.

Figure 17:
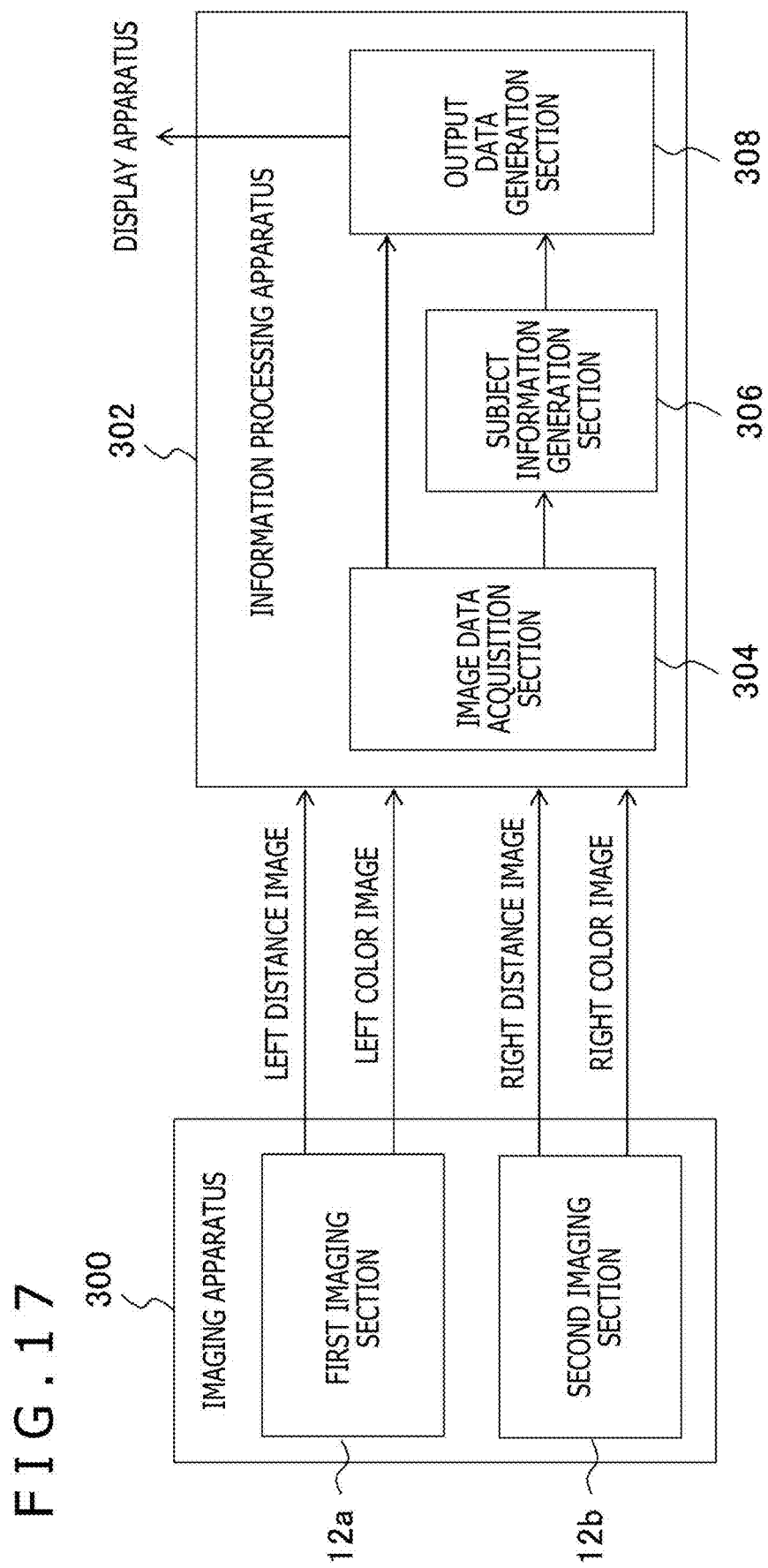
FIG. 17 is a diagram illustrating a configuration of functional blocks of a system when an imaging apparatus includes a stereo camera in the related technology.

As a modification example of the imaging apparatus 12, a stereo camera may be realized by providing the two imaging apparatuses having the configuration described so far. FIG. 17 illustrates a configuration of functional blocks of a system when the imaging apparatus includes a stereo camera. This system includes an imaging apparatus 300 and an information processing apparatus 302.

The imaging apparatus 300 includes a first imaging section 12a and a second imaging section 12b. Each of the first imaging section 12a and the second imaging section 12b corresponds to the imaging apparatus 12 illustrated in FIG. 1, and these sections are arranged on the left and right with a given space therebetween for use as the imaging apparatus 300. In the description given below, we assume that the first imaging section 12a and the second imaging section 12b are a left viewpoint camera and a right viewpoint camera, respectively. Each of the first imaging section 12a and the second imaging section 12b includes an image processing section having the function described with reference to FIG. 8. Therefore, the first imaging section 12a of the imaging apparatus 300 outputs left viewpoint distance image and color image data, and the second imaging section 12b outputs right viewpoint distance image and color image data.

The information processing apparatus 302 includes an image data acquisition section 304, a subject information generation section 306, and an output data generation section 308. The image data acquisition section 304 acquires image data from the imaging apparatus 300. The subject information generation section 306 generates comprehensive information regarding the subject's position and posture by combining these image data. The output data generation section 308 generates output data by using comprehensive information. The image data acquisition section 304 acquires the distance image and color image data acquired at least for each of the left and right viewpoints from the imaging apparatus 300.

The subject information generation section 306 generates final information regarding the subject's position, posture, shape, and so on by combining the distance images acquired from the imaging apparatus 300. That is, as for the portions of the subject invisible from one of the first imaging section 12a and the second imaging section 12b, the portions with an undefined distance are minimized by replenishing the data with the other distance image. Further, the subject information generation section 306 may separately generate, by the principle of triangulation, distance images by using left and right viewpoint color images or left and right viewpoint luminance images and combine the distance images.

Figure 18:
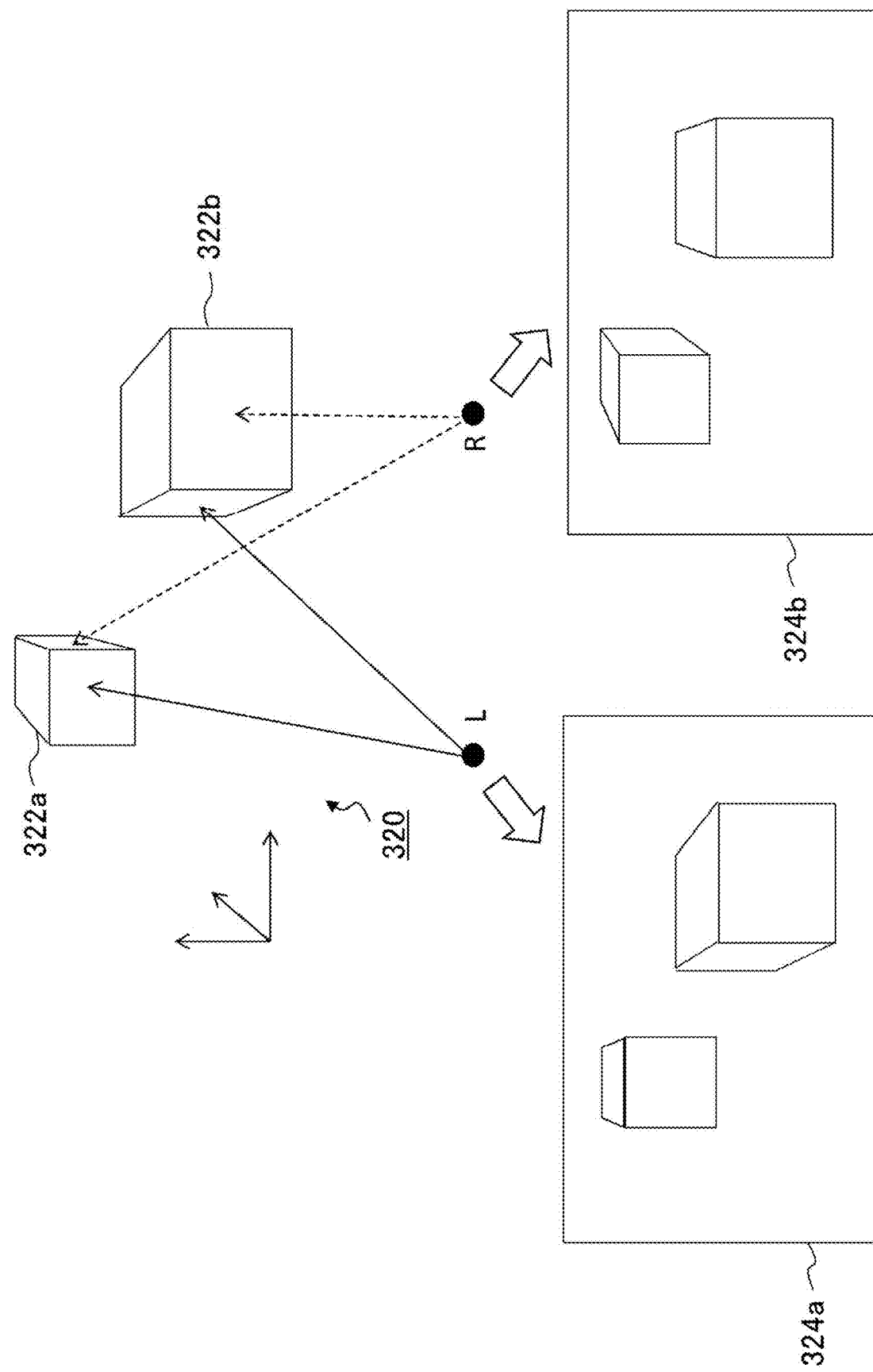
FIG. 18 is a diagram for describing a process performed by a subject information generation section to combine left and right viewpoint distance images in the related technology.

The output data generation section 308 generates data to be output such as display image by using left and right viewpoint color images and distance images. In the case where a display image is generated, the image is subjected to ordinary processes at the time of output such as linear matrix (color matrix) and gamma correction, after which the image is output to the display apparatus. FIG. 18 is a diagram for describing a process performed by the subject information generation section 306 to combine left and right viewpoint distance images. If a 3D space 320 where two cubes 322a and 322b exist from left and right viewpoints L and R as illustrated at the top in FIG. 18, a left viewpoint image 324a and a right viewpoint image 324b are acquired.

The region where the first imaging section 12a and the second imaging section 12b can acquire a distance value on their own is limited to the portions that appear as a silhouette in the left viewpoint image 324a and a right viewpoint image 324b, respectively. In the example illustrated, the left side surface of the cube 322b is visible only from the left viewpoint L, and the right side surface of the cube 322a is visible only from the right viewpoint R. Therefore, the distance values thereof are included only in one of the distance images. Therefore, the subject information generation section 306 curtails the regions with an undefined distance value by applying the value of the other distance image to the regions of the subject where no distance value has yet to be acquired with one of the distance images.

As a result, a model space closer to the 3D space 320 can be realized. That is, the subject information generation section 306 can generate information regarding the subject's position in the world coordinate system that is not limited to a single viewpoint by combining the distance images from a plurality of viewpoints. The position in question can be acquired for each minute region on the subject surface. As a result, this means that the subject's posture and shape are also obtained.

It should be noted that, as for the regions visible from both viewpoints, two distance values are available. Therefore, it is possible to enhance the accuracy by using, for example, the mean value thereof as a distance value. Further, the subject information generation section 306 may also generate itself distance images by using color images of left and right viewpoints and further combine the results thereof. In this case, distance values for portions visible from both viewpoints are further acquired. As a result, three distance values are available for the portion in question. The accuracy can be enhanced further by using the average thereof as a distance value. It should be noted, however, that the processing time can be reduced by omitting the generation of distance images using color images depending on the required accuracy.

It should be noted that the subject information generation section 306 may further fill distance value holes and further enhance the accuracy by other means. For example, deep leaning technology is on the way to commercialization as machine learning using a neural network. By taking advantage of this technology, the subject information generation section 306 is caused to learn how to derive a distance value or its change from a color or its change, a silhouette shape, and so on in a color image. Then, by using a color image actually acquired, the distance value of a region invisible from the viewpoints of the imaging apparatus may be estimated, or the distance value of a visible region may be enhanced by correction.

This technique is similarly effective for distance image data output from the imaging apparatus 12. Therefore, a subject information generation section having the same function may be provided in the information processing apparatus, not illustrated, that is connected to the imaging apparatus 12. This function is particularly effective in expanding the regions where distance values can be acquired and enhancing the accuracy in the case where the viewpoints of the imaging apparatus are limited or in a shooting environment with insufficient luminance. It should be noted that the functions of the information processing apparatus 302 including the subject information generation section 306 and some of the functions of the imaging apparatus 300 may be provided in other apparatus connected to a network or shared among a plurality of apparatuses to perform arithmetic operations. At this time, the information processing apparatus 302 and the display apparatus, not illustrated, may sequentially acquire results thereof and perform their own processes as appropriate or display an image in accordance with the results.

Figure 19:
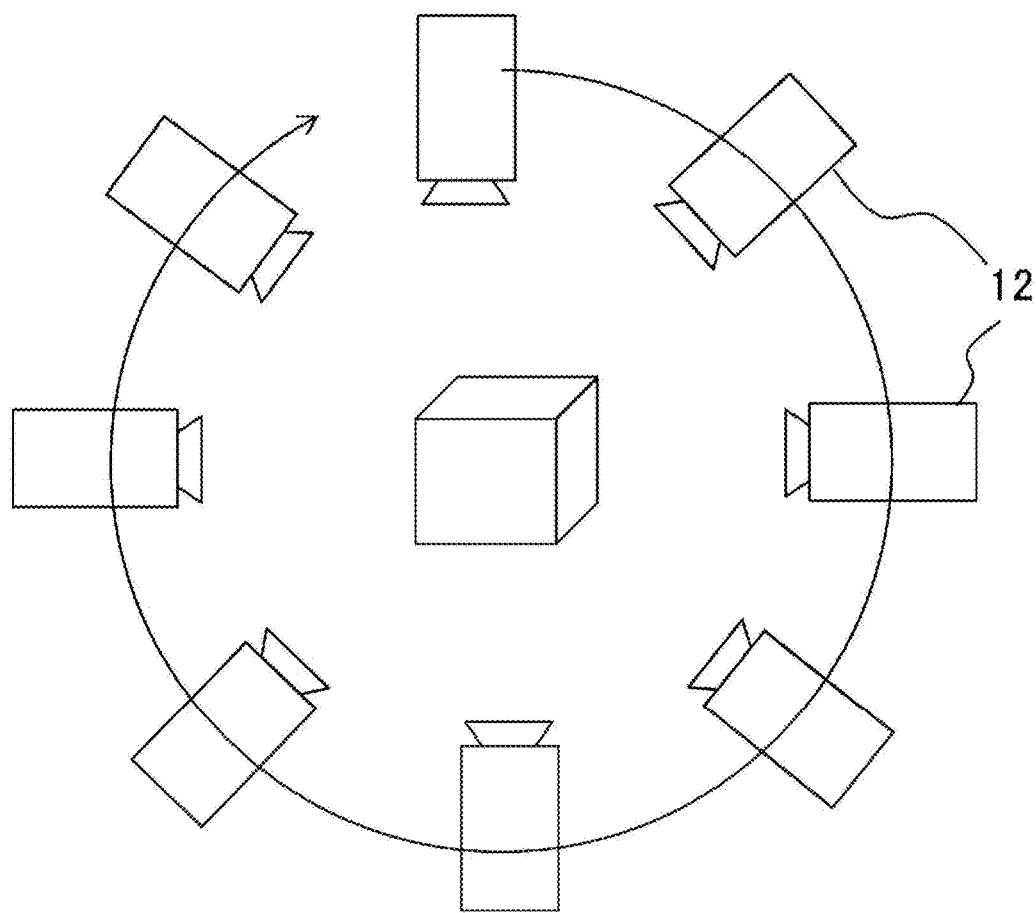
FIG. 19 is a diagram for describing a technique for acquiring information regarding a subject state in a 3D space while at the same time moving the imaging apparatus in the related technology.

Also, as illustrated in FIG. 17, by using a stereo camera as the imaging apparatus 300, it is possible to acquire the distance value of a region that is not visible with a monocular imaging apparatus. By developing this idea, the imaging apparatus 12 may be movable so that the regions where distance values can be acquired are further expanded. FIG. 19 is a diagram for describing a technique for acquiring information regarding subject states such as position, posture, shape, and so on in a 3D space through shooting while at the same time moving the imaging apparatus 12.

The illustrated example depicts the manner in which the imaging apparatus 12 is moved in a circular trajectory around a cube, the subject. Here, an acceleration sensor is provided in the imaging apparatus 12 so that a shooting time, a shot image, and the position and posture of the imaging apparatus 12 in the 3D space are recorded in association with each other. Then, acquired data is filled into a model space like the 3D space 320 illustrated in FIG. 18 on the basis of the color image and the distance image acquired for the viewpoint at each shooting time of a given rate. Such a process may be performed by the distance image generation section 38 in the imaging apparatus 12 or the subject information generation section 306 of the information processing apparatus 302.

If the process is performed inside the imaging apparatus 12, the processing burden on the information processing apparatus 302 can be reduced, thus keeping the increase in processing time to a minimum. It should be noted that how the imaging apparatus 12 is moved is not limited to that illustrated. For example, the imaging apparatus 12 may be moved within the range corresponding to the range of motion of a virtual viewpoint for a final image to be displayed. Alternatively, shot images in all directions may be acquired by rotating the imaging apparatus 12. Also, memory consumption can be kept to a minimum by ideas for improvement such as accumulating, of the pieces of data acquired by moving the imaging apparatus 12 in this manner, only the distance values for the feature points.

Alternatively, similar information can be acquired by arranging three or more shot images instead of moving the imaging apparatus 12. Also, in this case, the plurality of imaging apparatuses 12 are arranged in such a manner as to face each other in such a manner that optical axes converge near the subject. Alternatively, the imaging apparatuses 12 may be arranged in opposite orientation to the above in such a manner that the optical axes diverge outward. In these cases, color images and distance images from a plurality of viewpoints can be acquired at the same time of day. Therefore, these images may be connected together by a stitching process for use as wide angle information. At this time, the imaging apparatus 12 having the functional blocks illustrated in FIG. 8 may be used as only some of the plurality of imaging apparatuses provided.

For example, only the imaging apparatus that shoots a subject whose detailed information in a real space is desired includes a function to generate a distance image, and other imaging apparatuses generate only color images. This makes it possible to obtain detailed information regarding positions and postures of main subjects such as athletes while at the same time shooting a spacious stadium in all directions. As a result, it is possible to concentrate processing resources on a required target by performing subsequent processes including retouch and superimposition of virtual objects with high accuracy.

Figure 20:
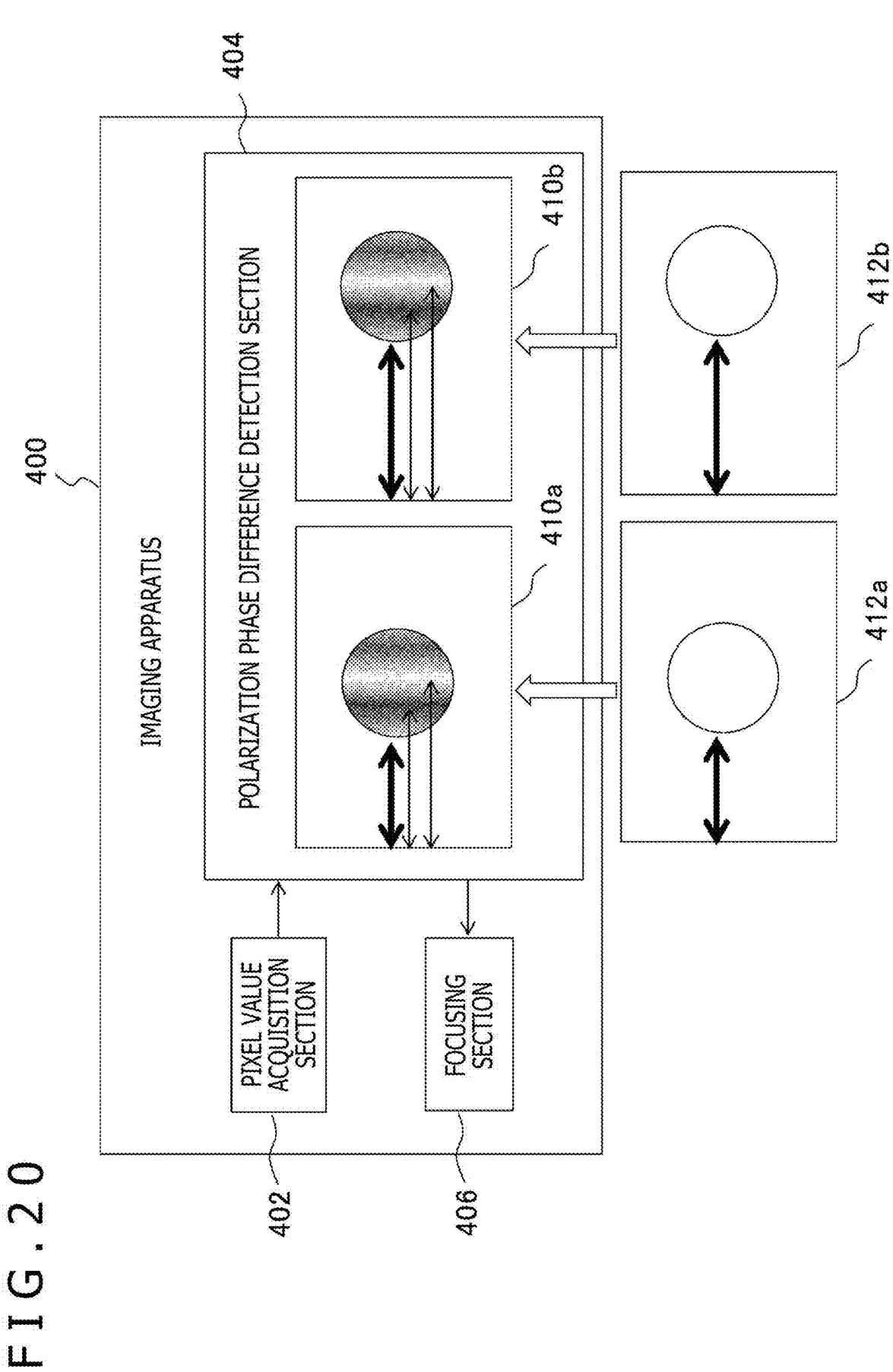
FIG. 20 is a diagram illustrating functional blocks of the imaging apparatus having a function to achieve focus using phase difference between polarizations in the related technology.

In the configuration of the imaging element in the present embodiment, light that has passed through the polarizer is detected by two photodiodes, thus allowing for acquisition of phase difference between polarization images. By taking advantage of this acquisition, the accuracy of a focusing function through phase difference between polarizations can be enhanced. FIG. 20 illustrates functional blocks of the imaging apparatus having a function to achieve focus through phase difference between polarizations. An imaging apparatus 400 includes a pixel value acquisition section 402, a polarization phase difference detection section 404, and a focusing section 406. The pixel value acquisition section 402 acquires a detection value of each photodiode. The polarization phase difference detection section 404 detects a phase difference between polarization images from the detection values of the two photodiodes of a pixel with a polarizer. The focusing section 406 adjusts the lens position on the basis of the phase difference between polarizations, thus allowing focus to be achieved at a proper position.

The pixel value acquisition section 402 reads out the detection values of the photodiodes in at least the pixels with a polarizer and performs given preprocessing such as A/D conversion and clamping process. The polarization phase difference detection section 404 separates polarization luminance distributions detected by the left and right photodiodes, thus generating polarization images in four directions for each of the distribution. Then, the polarization phase difference detection section 404 generates, as a phase difference image, a degree-of-polarization image that represents the degree of polarization acquired by using Formula 2 on the image plane or a normal image representing the normal vector acquired from the degree of polarization on the image plane. FIG. 20 illustrates phase difference images 410a and 410b using polarization generated in this manner.

Also, phase difference images 412a and 412b of ordinary natural light are illustrated at the bottom in FIG. 20 for comparison. In the example illustrated, a disk-shaped subject appears. In the case where the subject surface is monochromatic with a relatively smooth shape, the subject's outline is acquired as feature points in the phase difference images 412a and 412b of ordinary natural light. On the other hand, scant information is available regarding the subject surface. Even unevenness subject surface may not be captured as feature points due to a small change in luminance depending on lighting. Therefore, in the case where the positions of the feature points of the images 412a and 412b are identified as indicated by arrows and focus is achieved from the phase difference therebetween, it may not be possible to perform accurate adjustment due to scantiness of information.

On the other hand, the phase difference images 410a and 410b representing a degree of polarization or a normal vector represents undulation of the subject surface. As a result, the sensitivity to shape is higher than in the natural light images, making these images less prone to lighting. For this reason, even if the silhouette has a uniform look, variations occur as an image according to the shape as illustrated in the figure. Therefore, more feature point positions as grounds for phase difference are acquired as illustrated by the arrows. A more accurate and speedy adjustment can be realized by combining the positional relationships therebetween, deriving a phase difference, and performing the focusing process on the basis of the phase difference.

The focusing section 406 adjusts the lens by deriving its proper position on the basis of phase difference as in an ordinary focusing process. It should be noted that although attention is centered solely on the focusing function in depicting the functional blocks of the imaging apparatus 400 illustrated in the figure, it may be possible to output a distance image and a color image based on luminance data resulting from highly accurate focus by combining with the image processing section 22 illustrated in FIG. 8.

In the present embodiment described above, an imaging element includes a plurality of photodiodes provided per microlens, with a polarizer provided in an intermediate layer between at least some of the microlenses and the photodiodes. This allows for simultaneous acquisition of a polarization image and a phase difference image. Then, on the basis of the phase difference, distances at feature points of a subject are obtained, then the distances between the feature points are interpolated by using normal vectors acquired from polarization. This provides distance values for a spacious region of a shot image despite the fact that the camera is monocular.

In a distance measuring technology using an ordinary stereo camera, the distance is undefined for the surface of a subject that appears in an image from one of the viewpoints but does not appear in an image from the other viewpoint. The above technique of the present embodiment allows for derivation of a distance as long as the subject appears in a shot image, thus providing, in some cases, more pieces of distance data than when a stereo camera is used. This makes it possible to use the imaging apparatus in place of a stereo camera, thus downsizing the imaging apparatus having a distance measuring function.

Also, if such an imaging apparatus is realized as a stereo camera, the results of left and right shot images can be combined, thus providing distance values in an even wider range and allowing for the subject's position and posture in a 3D space to be realized with high accuracy. Further, obtaining distance images as conventionally done with color images from left and right viewpoints and combining the distance images ensures improved accuracy in distance information. These techniques are not dependent upon light in a specific wavelength band such as infrared light, thus allowing for acquisition of information outdoors and at other locations.

Also, it is possible to control those pixels with a polarizer and others with no polarizer properly, thus allowing for generation of color and phase difference images with conventional luminance levels. This makes the present embodiment applicable to any kinds of information processing tasks with no restrictions imposed on subsequent processes. Also, the processes of acquiring distance values on the basis of phase difference, generating normal images on the basis of polarization, and combining these to generate distance images can be basically performed row by row or every several rows of the image plane. Therefore, these processes can be implemented with the arithmetic circuit provided in the imaging apparatus by using line buffers. As a result, the functions can be shared with the apparatus that performs information processing tasks using various types of data and the apparatus that performs a display process, thus making it possible to handle shooting and display at a high frame rate.

Further, it is possible to acquire a phase difference between polarizations, thus allowing for extraction of changes in shape as feature points with high sensitivity even when the subject surface has scant undulation which would otherwise not be extracted as feature points in a natural light image. This makes it possible to acquire a large number of pieces of information as grounds for phase difference, thus ensuring even higher accuracy in the conventional focusing function. It should be noted that even in the case where the present embodiment is realized a stereo camera, more feature points can be acquired than in a natural light luminance image by using a degree-of-polarization image and a normal image, thus ensuring improved accuracy in generating a distance image by acquiring corresponding points from left and right viewpoint images.

The present invention has been described above on the basis of the present embodiment. It is to be understood by those skilled in the art that the above embodiment is illustrative, that various modification examples are possible in terms of a combination of constituent elements and processes, and that these modification examples also fall within the scope of the present invention.

For example, although photodiodes were used in the present embodiment, a mechanism mainly in charge of detection is not limited to photodiodes as long as the mechanism converts light into electric charge. For example, an organic photoelectric conversion film may be used as some or all the photodiodes. For example, the material and structure of the organic photoelectric conversion film can be determined as appropriate by using known technologies described in PCT Patent Publication No. WO2014/156659 and other documents.

Also, the present embodiment may be used in combination with a technology that measures distance by shining light in a specific wavelength band such as infrared light. That is, a mechanism for shining reference light is provided in the imaging apparatus 12, and reflected light thereof is detected by photodiodes. Shining reference light in a random pattern makes it possible to create feature points even on a subject surface with scant feature points. The processes performed by the image processing section are similar to those in the present embodiment. However, feature points abound as grounds for phase difference. Therefore, distance values based on phase difference can be acquired at a number of locations. This ensures improved accuracy in interpolating using normal vectors, thus allowing for acquisition of more accurate distance information. An illuminance sensor may be further provided in the imaging apparatus 12, thus shining reference light in the case where the illuminance is lower than a given value and preventing deterioration of the analysis accuracy caused by decline in illuminance.

Further, the imaging apparatus of the present embodiment may be realized by an ordinary camera whose principal function is to acquire color images. Alternatively, the imaging apparatus of the present embodiment may be provided in other apparatus having an imaging function. For example, the imaging apparatus of the present embodiment may be provided in a multifunctional mobile phone, a mobile terminal, a personal computer, a capsule endoscope, a wearable terminal, and so on. In the case where such an apparatus does not need to acquire a color image, the functions of the defect correction section 40 and the color image generation section 42 may be omitted, and only a distance image may be output. In this case, the color filter layer of the imaging element may be omitted.

Also, although each of all the pixel regions were in principle divided into partial regions with a photodiode provided in each partial region in the imaging element of the present embodiment, some pixels may include a single photodiode to correspond to one microlens without any division into partial regions. In this case, a phase difference image is acquired from the other pixel. Alternatively, conversely to the above, a plurality of photodiodes may be provided only in the pixels with a polarizer. In either case, the process of summing up the detection values described in the present embodiment can be omitted to provide a similar effect.

EMBODIMENTS

Embodiments of the present invention can be combined with the above related technology as appropriate. A description will be given below of first to fifth working examples as embodiments of the present invention.

First Working Example

An overview of an imaging apparatus of a first working example will be described. FIGS. 21(a) and 21(b) and FIGS. 22(a) and 22(b) illustrate comparisons between a conventional arrangement of cameras and an arrangement of cameras in the first working example. Also, FIGS. 21(a) and 21(b) and FIGS. 22(a) and 22(b) illustrate appearances of the cameras as seen from the front (in other words, from the subject side), that is, schematically illustrate the arrangement of camera lenses.

Figure 21:
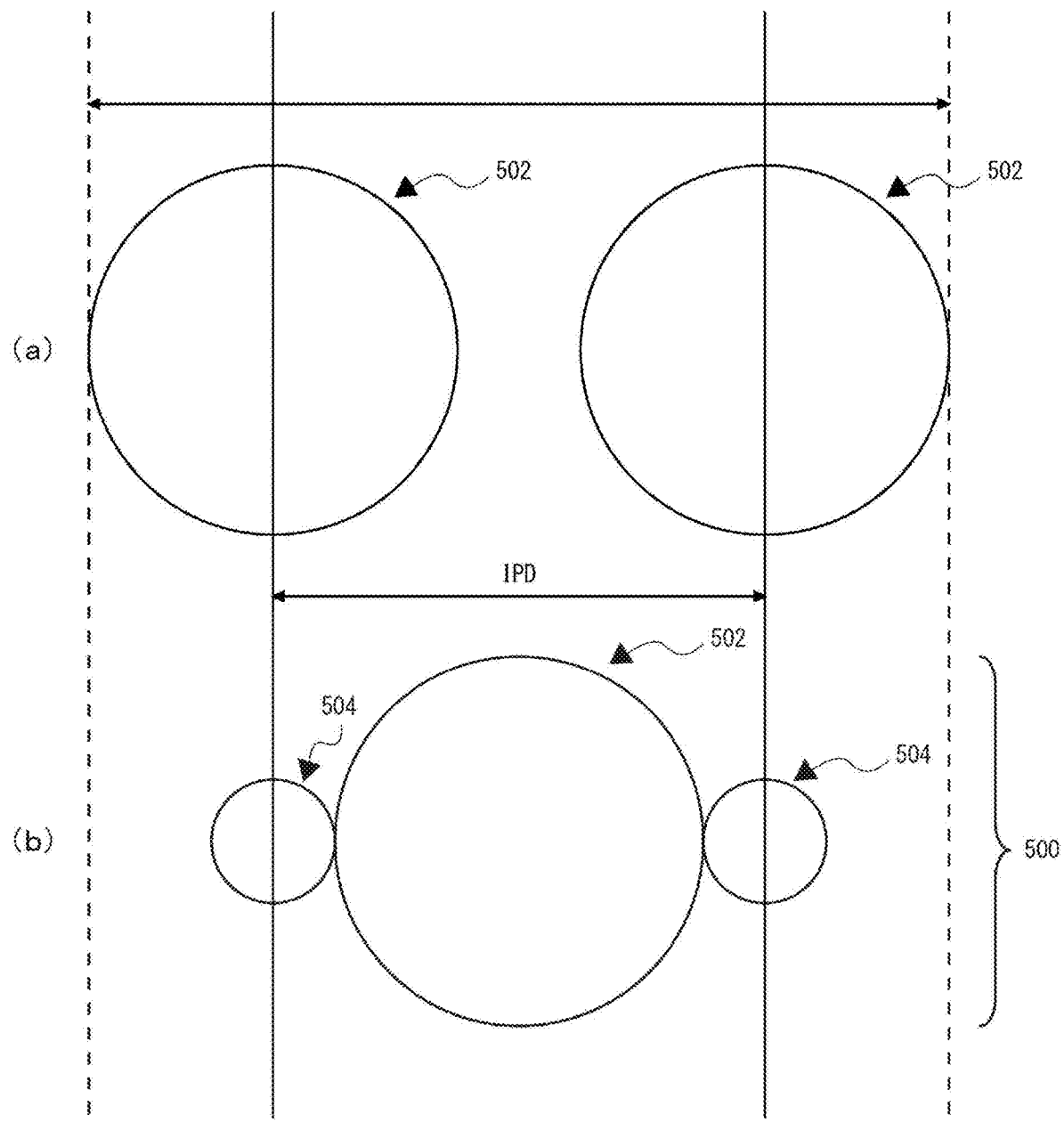
FIG. 21(a) is a diagram schematically illustrating a conventional arrangement of cameras.
FIG. 21(b) is a diagram schematically illustrating an arrangement of cameras in a first working example.

FIG. 21(a) schematically illustrates a conventional arrangement of cameras. In some cases, it has been common to provide two large cameras 502 at an IPD (Inter-Pupillary Distance, typically 60 to 70 mm) apart from each other to acquire right and left eye images (also collectively referred to as "parallax images"). In this case, the size of the imaging apparatus depicted with broken lines, in other words, the camera system size, increased, thus resulting in a problem.

FIG. 21(b) schematically illustrates an arrangement of cameras in the first working example. In an aspect of an imaging apparatus 500 of the first working example, a plurality of small cameras 504 are provided, one on the left and another on the right of a large camera 502 for capturing an image of a certain subject. The small cameras 504 capture images of the same subject. The large camera 502 is relatively large in optical size, and the small cameras 504 are relatively small in optical size. Typically, the large camera 502 is larger in lens size than the small cameras 504. In the example illustrated in FIG. 21(b), images captured by the two small cameras 504 at the IPD apart from each other can be acquired as parallax images, and the quality of the parallax images can be improved by using the image captured by the large camera 502.

Figure 22:
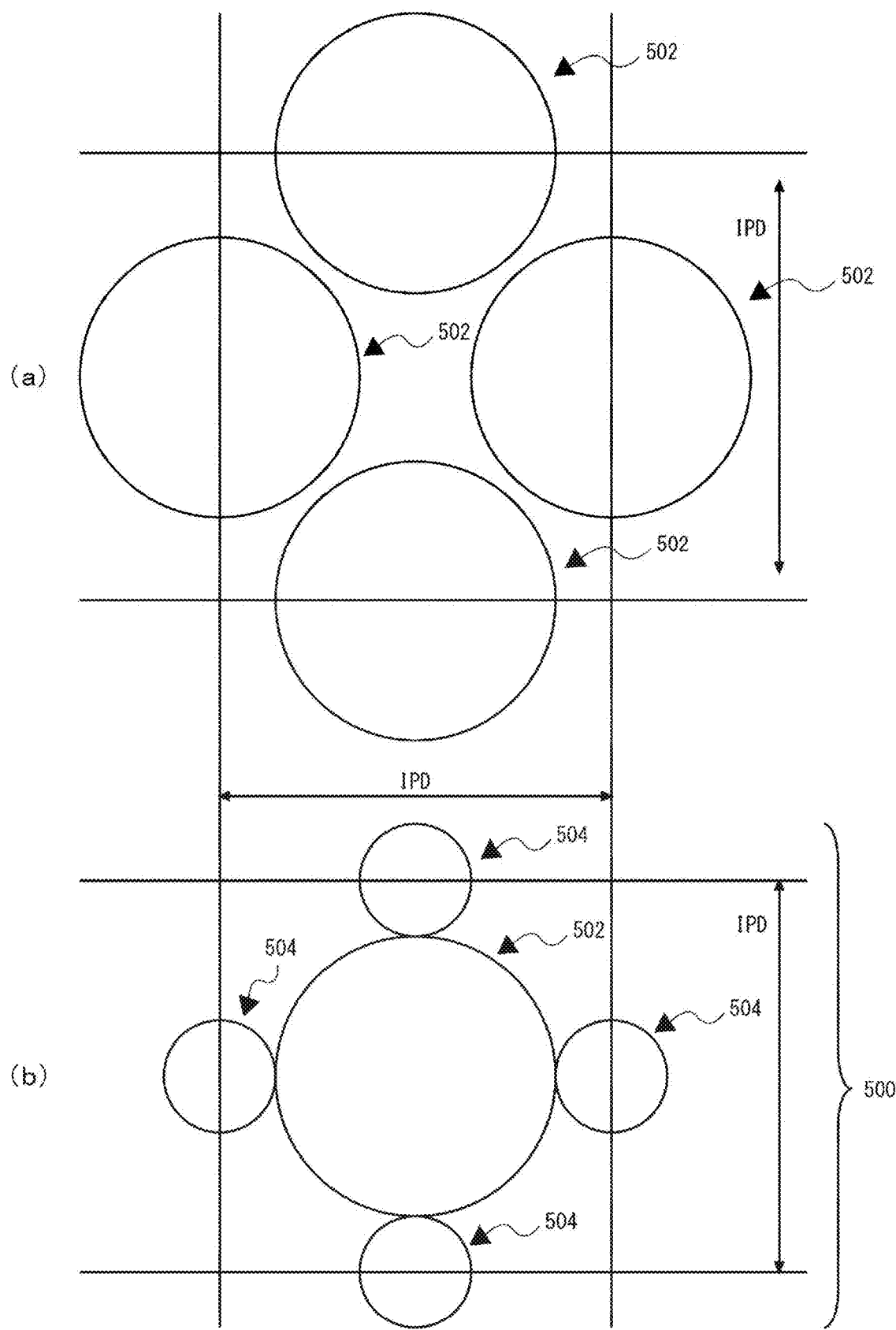
FIG. 22(a) is a diagram schematically illustrating a conventional arrangement of cameras.
FIG. 22(b) is a diagram schematically illustrating an arrangement of cameras in the first working example.

FIG. 22(a) also schematically illustrates a conventional arrangement of cameras. It has been necessary to arrange the large cameras 502 vertically to acquire vertical parallax images, thus resulting in an even larger size of the imaging apparatus. For example, the vertical camera-to-camera distance has exceeded the IPD in some cases, that is, problems associated with the size and the IPD limitation have occurred in some cases.

FIG. 22(b) schematically illustrates an arrangement of cameras in the first working example. In an aspect of the imaging apparatus 500 of the first working example, the plurality of small cameras 504 are provided, one on the left, another on the right, still another above, and still another below the large camera 502. This working example provides not only horizontal parallax images but also vertical parallax images while at the same time preventing the imaging apparatus 500 from growing in size.

Figure 23:
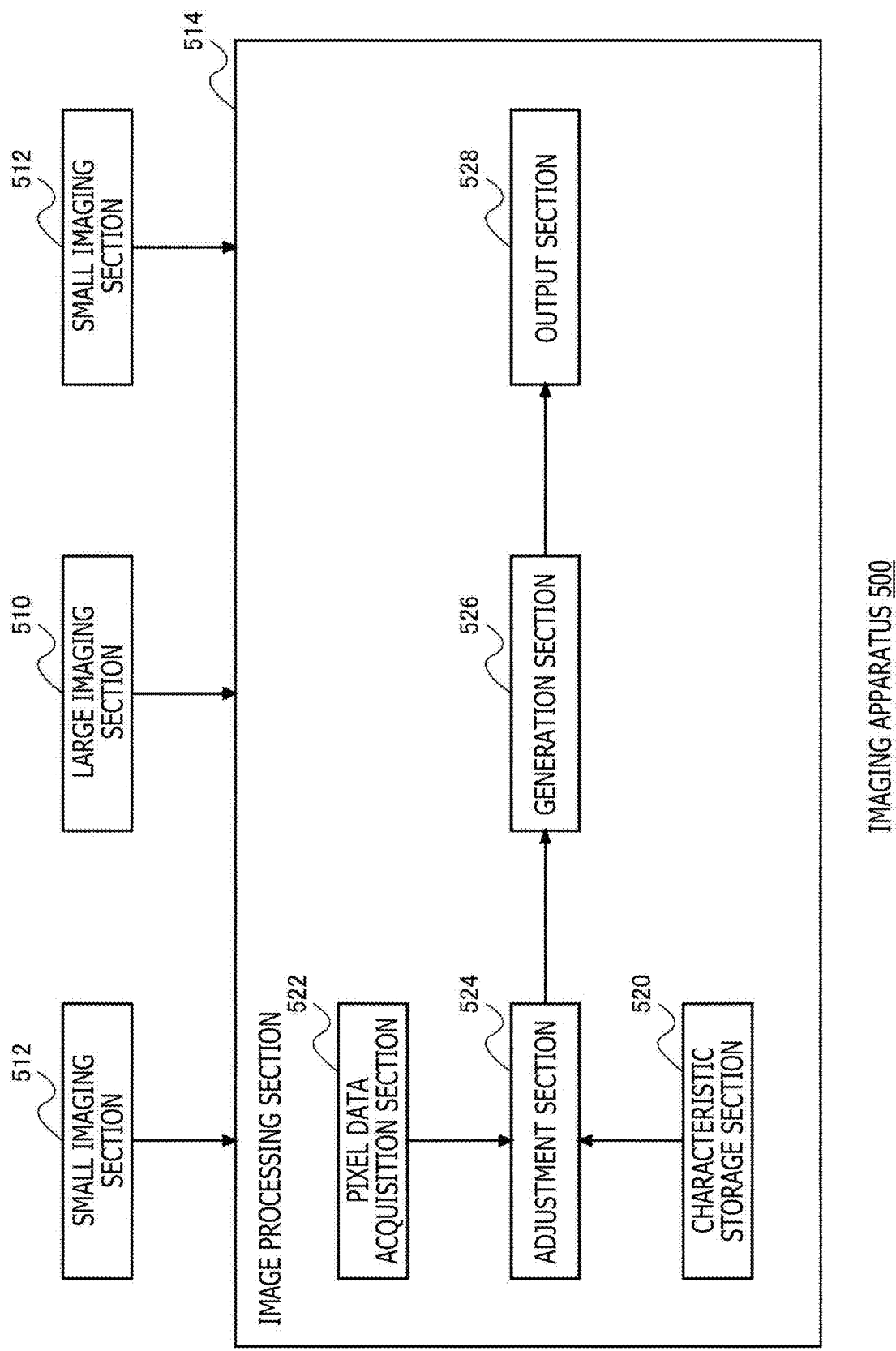
FIG. 23 is a block diagram illustrating a functional configuration of an imaging apparatus of the first working example.

The imaging apparatus 500 of the first working example generates parallax images and/or a wide-angle image to be displayed on a head-mounted display (hereinafter also referred to as an "HMD"). FIG. 23 is a block diagram illustrating a functional configuration of the imaging apparatus 500 of the working example. The imaging apparatus 500 includes a large imaging section 510, two small imaging sections 512, and an image processing section 514.

In the block diagrams of the present specification, each element described as a functional block for performing various processing tasks can include, in terms of hardware, circuit blocks, memories, and other LSIs (Large Scale Integrations), and, in terms of software, a program loaded into the memory and so on. Therefore, it is understood by those skilled in the art that these functional blocks can be realized in various manners by hardware alone, software alone, or a combination thereof and are not limited to any one of them. For example, a computer program including a plurality of modules corresponding to the plurality of functional blocks illustrated in FIG. 23 may be installed to a storage of the imaging apparatus 500. A CPU (Central Processing Unit) or a GPU (Graphics Processing Unit) of the imaging apparatus 500 may deliver the functions of the respective functional blocks by reading the computer program into a main memory for execution.

The large imaging section 510 corresponds to the large camera 502 illustrated in FIG. 21(b) and captures an image of a subject existing in front of the imaging apparatus 500. The subject includes, for example, a 3D space and objects located therein. The small imaging sections 512 correspond to the small cameras 504 illustrated in FIG. 21(b) and capture images of the subject. The large imaging section 510 is larger in optical size than the small imaging sections 512 and can provide an image of higher quality than the images of the small imaging sections 512.

In the first working example, the two small imaging sections 512 are provided, one on the left and another on the right of the large imaging section 510 and in proximity thereto as in FIG. 21(b). As a modification example, the plurality of small imaging sections 512 may be provided, one above and another below (and further one or more at diagonal positions relative to) the large imaging section 510. For example, three or more small imaging sections 512 may be provided in directions where parallax should be acquired.

The image processing section 514 generates data to be output to an external apparatus on the basis of an image captured by the large imaging section 510 and images captured by the small imaging sections 512. The image processing section 514 includes a characteristic storage section 520, a pixel data acquisition section 522, an adjustment section 524, a generation section 526, and an output section 528.

The characteristic storage section 520 stores data regarding a characteristic of the image captured by the large imaging section 510 (hereinafter also referred to as "characteristic data"). Also, the characteristic storage section 520 stores characteristic data of the image captured by each of the plurality of small imaging sections 512. Characteristic data can also be said to be data representing the characteristics of pixel values acquired from imaging elements of each of the imaging sections. Also, characteristic data may include data representing at least a feature or tendency of at least one of hue, brightness, and chroma. Also, characteristic data may include, in the case where the characteristic of the image captured by the large imaging section 510 and the characteristics of the images captured by the plurality of respective small imaging sections 512 differ, data representing details of the difference or an extent to which the image characteristics differ.

It should be noted that although characteristic data stored in the characteristic storage section 520 may represent the characteristic calculated from post-shooting data, the image characteristics may be measured in a testing process during manufacture of the cameras (the large imaging section 510 and each of the small imaging sections 512) or the imaging element (image sensor) and stored in the ROM (Read-Only Memory) (the characteristic storage section 520). As an example of characteristic measurement in the testing process, signals, noise, and other information acquired from the pixels when the lens, illuminance, wavelength, or other parameter is changed may be measured in the post-manufacture testing process of the cameras or imaging elements alone. As another example, stitching position misalignment, contrast, and color difference after combining of the plurality of cameras (e.g., the large imaging section 510 and each of the small imaging sections 512) may be measured in the testing process after the combining of the plurality of cameras.

The pixel data acquisition section 522 acquires data of the image captured by the large imaging section 510, i.e., the value of each pixel. Also, the pixel data acquisition section 522 acquires data of the image captured by each of the plurality of small imaging sections 512, i.e., the value of each pixel.

The characteristic of the image captured by the large imaging section 510 may differ from the characteristic of the image captured by each of the plurality of small imaging sections 512. For example, there are cases in which while the image captured by the large imaging section 510 has a reddish tinge, the images captured by the small imaging sections 512 have a bluish tinge. In this case, synthesizing these images may result in an unnatural image color. For this reason, on the basis of the characteristic data stored in the characteristic storage section 520, the adjustment section 524 makes adjustments in such a manner as to achieve a match between the characteristic of the image captured by the large imaging section 510 and the characteristic of the image captured by each of the plurality of small imaging sections 512.

Specifically, the adjustment section 524 corrects the image captured by each of the plurality of small imaging sections 512 to ensure that the characteristic of the image captured by each of the plurality of small imaging sections 512 matches the characteristic of the image captured by the large imaging section 510. For example, the characteristic storage section 520 may store characteristic data representing the difference in characteristic between the image captured by the large imaging section 510 and the image captured by each of the plurality of small imaging sections 512. In this case, the adjustment section 524 may adjust the pixel value acquired from each of the plurality of small imaging sections 512 such that the difference represented by the characteristic data is cancelled out.

As described above, it is possible to generate a natural-looking image on the basis of the images of the large imaging section 510 and the small imaging sections 512 by making adjustments such that the images of the large imaging section 510 and the small imaging sections 512 offer comparable characteristics. Also, in general, correcting an image leads to deterioration of the image quality. For this reason, the quality deterioration of the high-quality image captured by the large imaging section 510 can be kept to a minimum by correcting the low-quality images captured by the small imaging sections 512 without changing the high-quality image captured by the large imaging section 510. This also keeps, to a minimum, the quality deterioration of the image obtained by synthesizing the images of the large imaging section 510 and the small imaging sections 512. This is particularly suitable in the case where the image of the large imaging section 510 is displayed within a user's field of view (i.e., in a region where the user's eye resolution is high).

The adjustment section 524 inputs the data of the image captured by the large imaging section 510 and the data of the image captured by each of the plurality of small imaging sections 512 (the corrected data) to the generation section 526. The generation section 526 generates data to be output to an external apparatus on the basis of the plurality of types of input data. In the working examples, a VR (Virtual Reality) image, an AR (Augmented Reality) image, or a wide-angle image is generated.

The output section 528 transmits the data generated by the generation section 526 to a given external apparatus (e.g., information processing apparatus). The output section 528 of the working example transmits a VR image, an AR image, or a wide-angle image generated by the generation section 526 to an HMD for display on the HMD screen. It should be noted that the output section 528 may store data generated by the generation section 526 in a given storage apparatus or recording medium.

Figure 24:
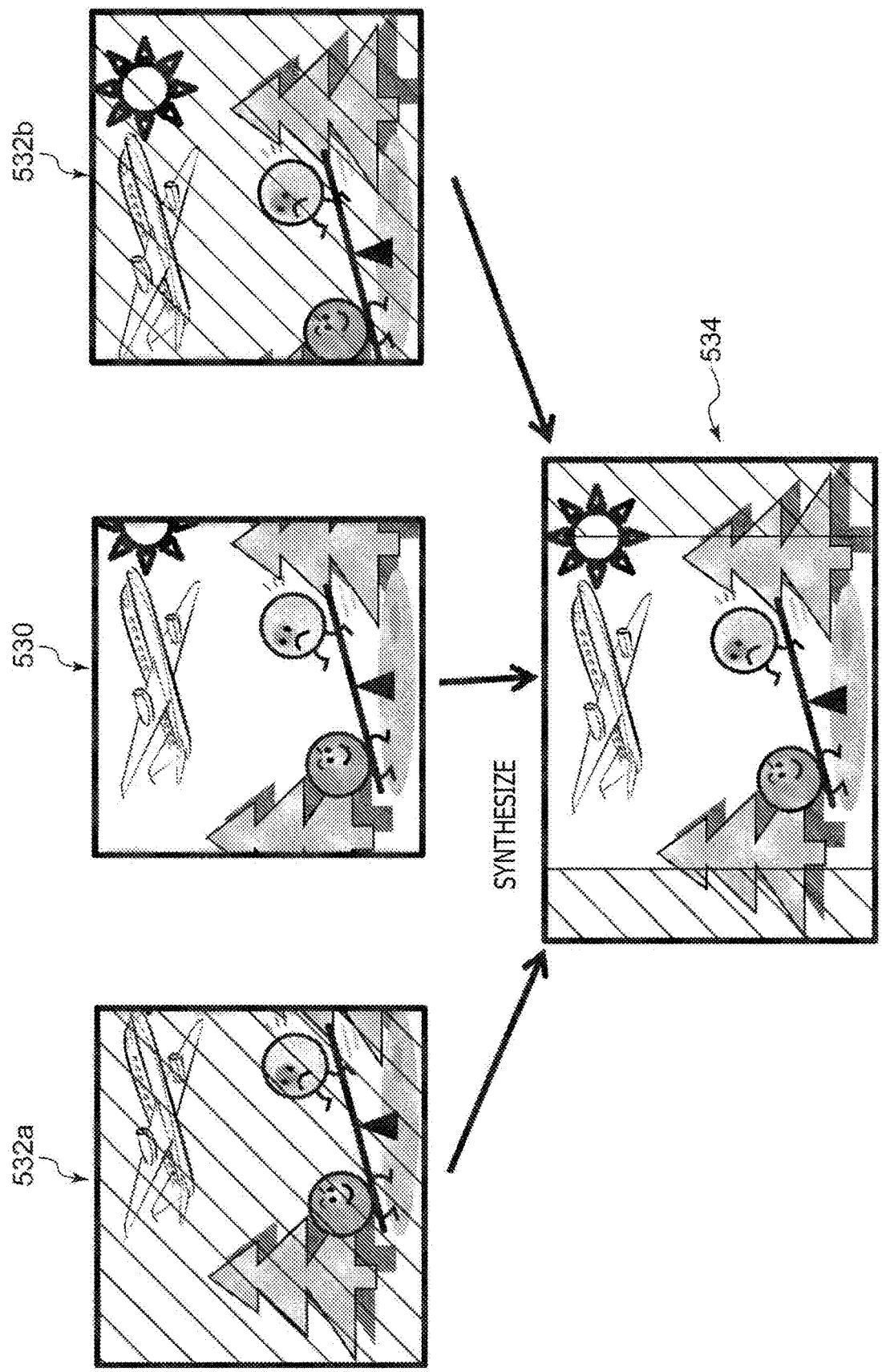
FIG. 24 is a diagram illustrating an example of image synthesis.

Specific processes performed by the generation section 526 will be described. The generation section 526 may synthesize the image captured by the large imaging section 510 and the images captured by the plurality of small imaging sections 512 and output a wide-angle image resulting from the synthesis to the output section 528. FIG. 24 illustrates an example of image synthesis. A center image 530 is an image of relatively high quality captured by the large imaging section 510. A left image 532a is an image of relatively low quality captured by the small imaging section 512 provided on the left side of the large imaging section 510. A right image 532b is an image of relatively low quality captured by the small imaging section 512 provided on the right side of the large imaging section 510. In FIG. 24, low image quality regions are shaded.

The generation section 526 may generate a synthesized image 534 by synthesizing the left image 532a on the left side of the center image 530 and the right image 532b on the right side of the center image 530. This makes it possible to acquire a wide-angle image with a complemented occlusion region, a region that cannot be shot with the large imaging section 510, as the synthesized image 534. With human eyes, the closer to the center, the higher the resolution, and the closer to the periphery, the lower the resolution. The center portion of the synthesized image 534 is of high quality, that is, a wide-angle image suitable for human eyes can be provided.

Also, the generation section 526 may change a synthesis ratio (in other words, a blending ratio) according to an image synthesis position. For example, the generation section 526 may increase, of the overlapping portions of the center image 530 and the left image 532a (and similarly the right image 532b), the ratio in which the pixel value of the left image 532a is reflected with decreasing distance to the peripheral region. Conversely, the generation section 526 may increase the ratio in which the pixel value of the center image 530 is reflected with decreasing distance to the center region. This prevents the user from feeling a sense of discomfort toward the synthesized image 534 by the difference of image qualities of the center image 530 and the left image 532a (and similarly the right image 532b).

Also, the generation section 526 may generate at least one of two pieces of data, namely, data regarding parallax and data regarding distance to the subject, on the basis of the image captured by the large imaging section 510 and at least two of the plurality of images captured by the plurality of small imaging sections 512. The data regarding the distance can be said to be depth information.

As illustrated in FIG. 21(b), in the case where the distance between the two small imaging sections 512 is equal to the IPD, the generation section 526 may determine the images generated by the respective two small imaging sections 512 as parallax images to be displayed on the HMD. For example, the generation section 526 may determine the image captured by the small imaging section 512 on the left side (referred to as a "left image") as a left eye image and the image captured by the small imaging section 512 on the right side (referred to as a "right image") as a right eye image.

In this case, the generation section 526 may store a correspondence between the image captured by the large imaging section 510 (referred to as a "center image") and the left image. This correspondence may be, for example, a correspondence between pixels of one of the images and pixels of the other image or a correspondence between pixels for capturing images of the same portion (position) of the subject. The generation section 526 may correct the value of each pixel of the left image on the basis of the value of the corresponding pixel of the center image and may, for example, replace the pixel value. Similarly, the generation section 526 may store a correspondence between the right image and the center image and correct the value of each pixel of the right image on the basis of the value of the corresponding pixel of the center image. This contributes to improved quality of the left and right eye images.

Also, the generation section 526 may generate new left and right eye images on the basis of the data of the center, left, and right images. In this case, the distance between the small imaging section 512 on the left side and the small imaging section 512 on the right side may be different from the IPD and may be, for example, 100 mm or more.

Figure 25:
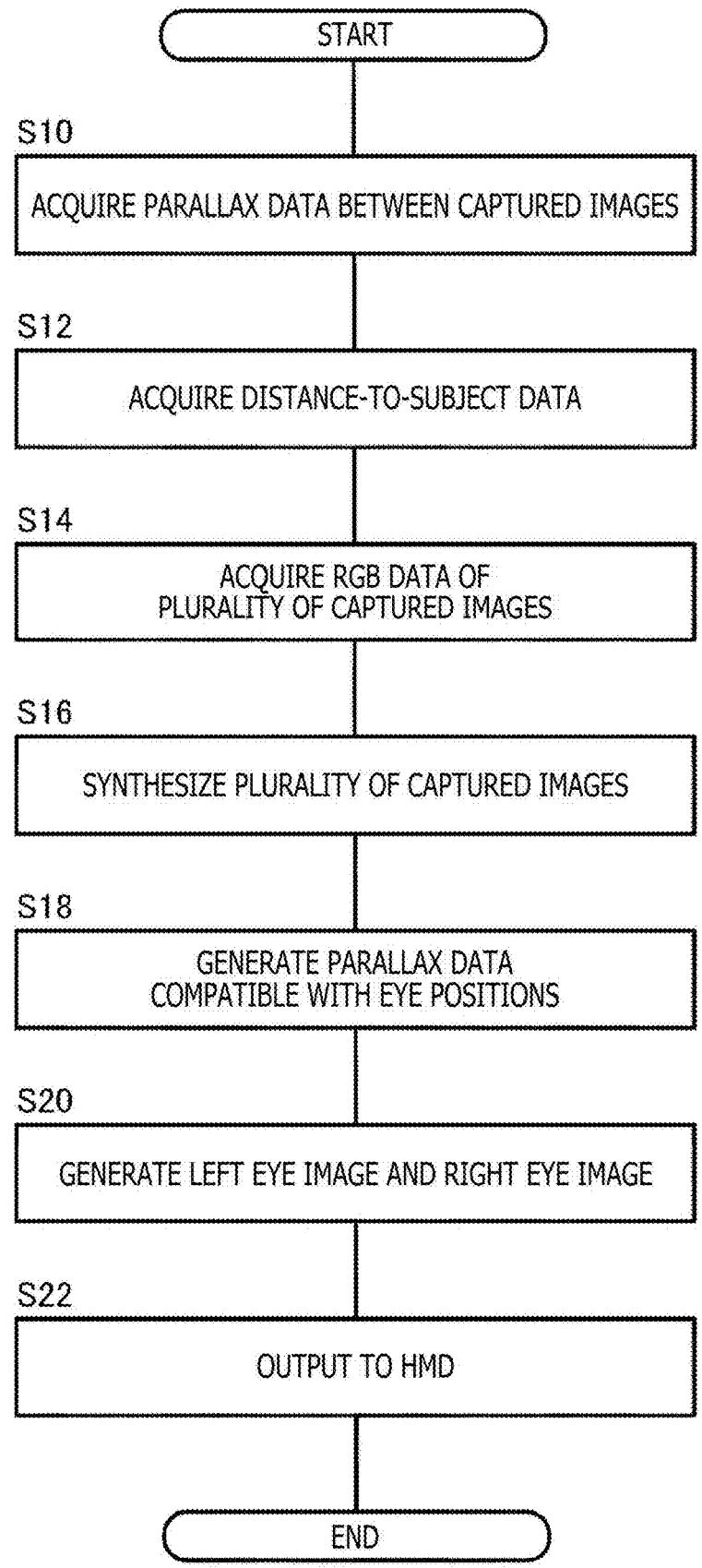
FIG. 25 is a flowchart illustrating processes performed by a generation section in the first working example.

FIG. 25 is a flowchart illustrating processes performed by the generation section 526 in the first working example. The generation section 526 detects the parallax between the left and right images (in other words, the magnitude of misalignment between subject image capture positions). Also, the generation section 526 detects the parallax between the left and center images. Also, the generation section 526 detects the parallax between the right and center images (S10). The generation section 526 estimates the distance to the subject on the basis of the parallax detected in S10 (S12).

For example, the generation section 526 may generate first distance data representing the distance to the subject through triangulation based on the parallax between the left and right images. Also, the generation section 526 may generate second distance data representing the distance to the subject through triangulation based on the parallax between the left and center images. Also, the generation section 526 may generate third distance data representing the distance to the subject through triangulation based on the parallax between the right and center images. The generation section 526 may generate distance images representing the distances to the subject in the form of pixel values as the first to third distance data. The generation section 526 may generate a final estimated distance value by smoothing the first to third pieces of distance data or processing the data in other ways.

The generation section 526 acquires RGB data of each of the left, center, and right images (S14) and generates a synthesized image (e.g., synthesized image 534 in FIG. 24) obtained by synthesizing the left, center, and right images (S16). It should be noted that there are no limitations on the order of the processes in S12 and S14 and those in S14 and S16. Therefore, the two sets of processes may be performed in parallel.

The generation section 526 generates parallax information compatible with the eye positions of the user wearing the HMD by performing the inverse of triangulation on the basis of the distance to the subject (S18). The generation section 526 generates the left eye image and the right eye image on the basis of the parallax information obtained in S18 (S20). For example, the left eye image and the right eye image having misalignment representing the parallax information generated in S18 may be extracted from the synthesized image generated in S16. The generation section 526 outputs the left eye image and the right eye image to the output section 528 for display on the HMD (S22). It should be noted that the generation section 526 may output the distance images to the output section 528 and that the output section 528 may transmit the distance images to the given external apparatus.

The imaging apparatus 500 of the first working example provides parallax images in a variety of directions including vertical direction and a wide-angle image while at the same time preventing the apparatus from growing in size. Also, the imaging apparatus 500 makes it easier to ensure the image quality while at the same time preventing the apparatus from growing in size.

Second Working Example

From a second working example onward, the constituent elements corresponding to those of the first working example will be denoted by the same reference signs for description. Also, from the second working example onward, primary focus will be placed on differences from the first working example to omit redundant description as appropriate.

Figure 26:
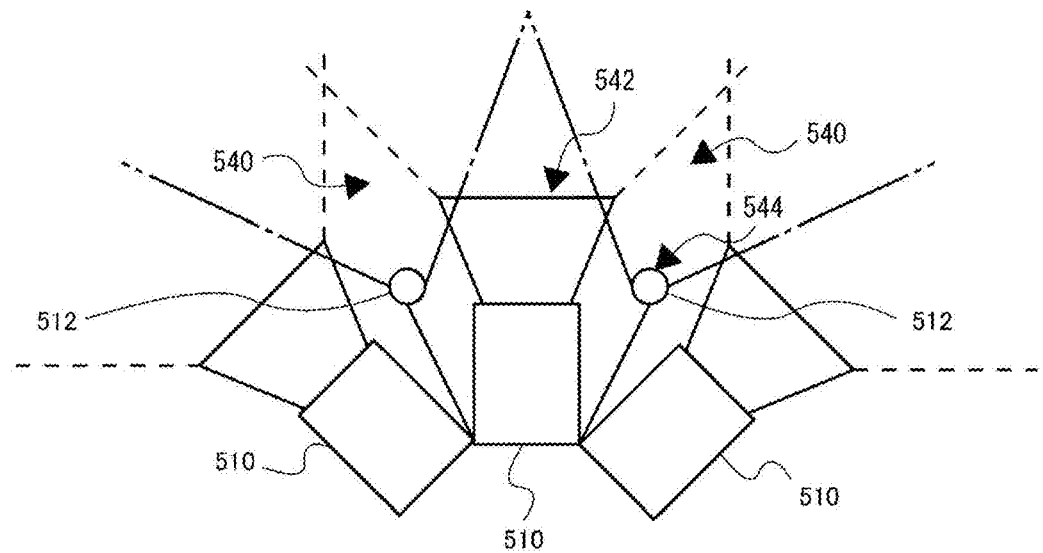
FIG. 26 is a diagram schematically illustrating a configuration of an imaging apparatus of a second working example.

FIG. 26 schematically illustrates a configuration of the imaging apparatus 500 of the second working example. FIG. 26 illustrates the configuration as seen from above the imaging apparatus 500. The imaging apparatus 500 includes the plurality of large imaging sections 510 (three in FIG. 26) and the plurality of small imaging sections 512 (two in FIG. 26). The plurality of large imaging sections 510 capture images of subjects located in different directions from each other, and in FIG. 26, the large imaging sections 510 capture images 45 degrees out of alignment with each other. At least one of the small imaging sections 512 (each of all the small imaging sections 512 in the second working example) is provided between the plurality of large imaging sections 510. The generation section 526 may generate a wide-angle image (180-degree image in FIG. 26) obtained by synthesizing a plurality of images captured by the plurality of large imaging sections 510 and a plurality of images captured by the plurality of small imaging sections 512.

In FIG. 26, view angles of the large imaging sections 510 are denoted by broken lines, and view angles of the small imaging sections 512 are denoted by dot-and-dash lines. It is possible to prevent occurrence of blind spots 540 in proximity regions of the large imaging sections 510 by providing the small imaging section 512 between the plurality of large imaging sections 510.

Also, as illustrated in FIG. 26, lens tip portions 542 of the plurality of large imaging sections 510 are located closer to the subjects than lens tip portions 544 of the plurality of small imaging sections 512. In other words, a circle connecting the lens tip portions 544 of the plurality of small imaging sections 512 is inside (smaller in radius than) a circle connecting the lens tip portions 542 of the plurality of large imaging sections 510. This prevents the small imaging sections 512 from being included in the view angles of the large imaging sections 510, in other words, prevents the small imaging sections 512 from being undesirably visible in high-quality images captured by the large imaging sections 510.

Third Working Example

Figure 27:
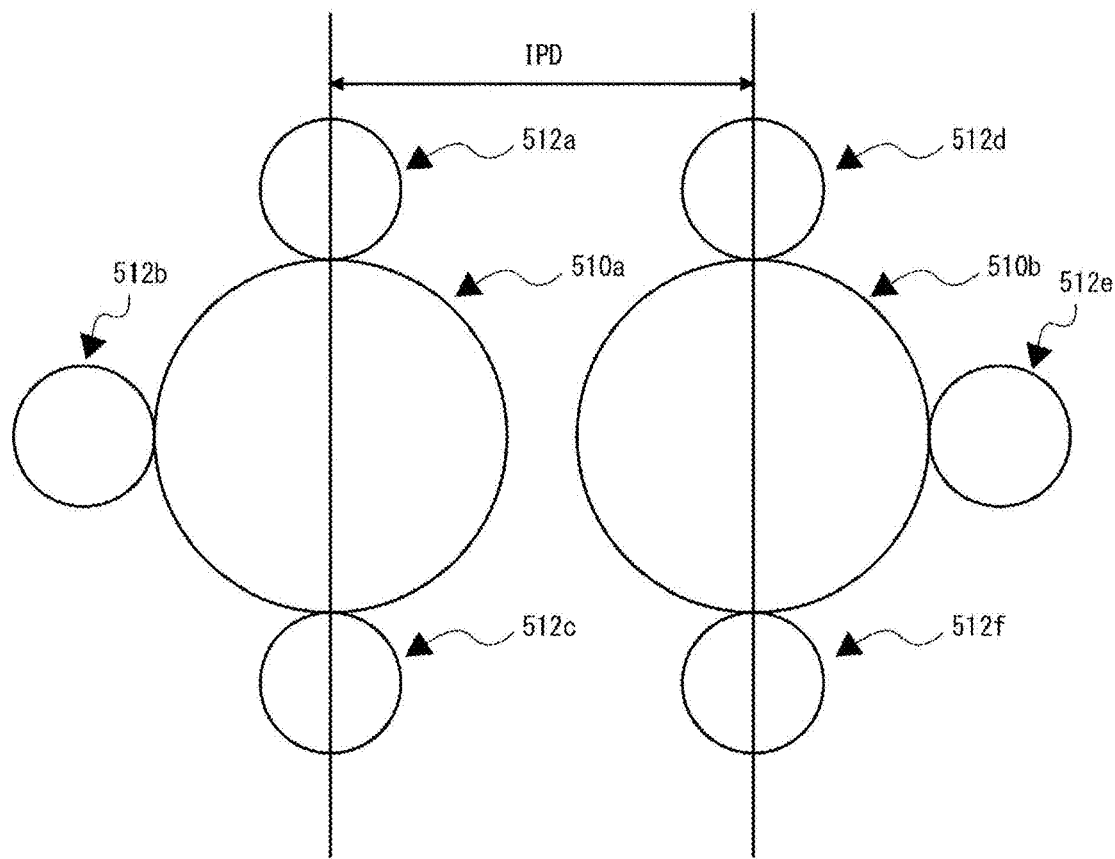
FIG. 27 is a diagram schematically illustrating a configuration of an imaging apparatus of a third working example.

FIG. 27 schematically illustrates a configuration of the imaging apparatus 500 of a third working example. FIG. 27 illustrates the configuration as seen from above the imaging apparatus 500. The imaging apparatus 500 includes a plurality of large imaging sections (large imaging sections 510a and 510b) and a plurality of small imaging sections (small imaging sections 512a to 512f). The large imaging sections 510a and 510b perform image capture in the same direction, in other words, capture images of subjects existing in the same direction.

The small imaging sections 512a, 512b, and 512c are provided around the large imaging section 510a, and the small imaging sections 512d, 512e, and 512f are provided around the large imaging section 510b. Each of the small imaging sections 512a to 512f carries out image capture in the same direction as the large imaging sections 510a and 510b. It should be noted that small imaging sections may be further provided at diagonal positions relative to the large imaging sections.

In the third working example, the large imaging sections 510a and 510b are provided at the IPD apart from each other. The generation section 526 generates a right eye image on the basis of the high-quality image captured by the large imaging section 510a and a left eye image on the basis of the high-quality image captured by the large imaging section 510b. As a modification example, the distance between the large imaging sections 510a and 510b may be different from the IPD. In that case, the generation section 526 may obtain a distance to the subject on the basis of the high-quality images captured by the plurality of large imaging sections and the low-quality images captured by the plurality of small imaging sections and generate right and left eye images on the basis of the distance.

In the third working example, the imaging apparatus 500 further includes a posture detection section that detects a posture of the HMD on the basis of output signals of sensors (e.g., acceleration sensor and gyro sensor) incorporated in the HMD and/or images depicting the appearance of the HMD captured by a given camera. The posture detection section detects, as an HMD posture, the direction of the line of sight of the user wearing the HMD and the inclination of the line of sight of the user (in other words, inclination of the line connecting the two eyes).

The generation section 526 of the imaging apparatus 500 may select, of the plurality of images captured by the plurality of imaging sections, some images according to the direction of the line of sight and/or the inclination of the line of sight detected by the posture detection section. The generation section 526 may generate right and left eye images on the basis of the selected images. For example, in the case where the user's left line of sight is tilted upward and the user's right line of sight is tilted diagonally downward, the generation section 526 generates a left eye image by using the image captured by the small imaging section 512a and a right eye image by using the image captured by the small imaging section 512f. In this case, as described in the first working example, the generation section 526 may improve the quality of the left and right eye images by using the images captured by the large imaging sections 510a and 510b.

Also, the small imaging sections 512b and 512e illustrated in FIG. 27 are provided at positions more than IPD apart. The generation section 526 may generate a left eye image by using the image captured by the small imaging section 512b in the case where the user's line of sight moves more to the left than until then. For example, the generation section 526 may derive distance-to-subject data for generating a left eye image and color data of the subject by using the image captured by the large imaging section 510a and the image captured by the small imaging section 512b.

Similarly, the generation section 526 may generate a right eye image by using the image captured by the small imaging section 512e in the case where the user's line of sight moves more to the right than until then. As described above, the third working example has small imaging sections arranged above, below, and on the left and right of each of the plurality of large imaging sections, thus making it easier to present, to the user, appropriate parallax images responsive to the change in the direction of the user's line of sight and the change in the inclination of the user's line of sight.

Incidentally, in order to obtain the distance to a subject required to generate right and left eye images to be displayed on the HMD, a plurality of images of the subject captured by a plurality of imaging sections are necessary. However, there is a region (occlusion region) that is visible in only one of the image captured by the large imaging section 510a and the image captured by the large imaging section 510b. As a result, parallax in the occlusion region cannot be obtained from the image captured by the large imaging section 510a and the image captured by the large imaging section 510b alone, thus making it impossible to obtain the distance to the subject in the occlusion region.

For this reason, in the third working example, parallax occlusion that takes place in the large imaging sections is interpolated with image capture data from the small imaging sections. Specifically, the generation section 526 derives the distance to the subject in an occlusion region of the image captured by the large imaging section 510a that is not visible in the image captured by the large imaging section 510b on the basis of the image captured by the small imaging section 512a, 512b, or 512c provided around the large imaging section 510a. This makes it possible to obtain, without omission, the distance to the subject in the regions that are included in at least one of the images captured by the large imaging section 510a and the large imaging section 510b.

Fourth Working Example

The imaging apparatus 500 of a fourth working example enhances the quality of data to be output by taking advantage of results of machine learning (e.g., deep learning).

The imaging apparatus 500 of the fourth working example further includes a learning result storage section (not depicted) that stores machine learning results. The learning result storage section stores two types of learning results (1) a first learning result for obtaining the distance to the subject on the basis of the plurality of images acquired from the plurality of imaging sections, and (2) a second learning result for correcting the images captured by the small imaging section 512 with the images captured by the large imaging section 510.

The first learning result may be a machine learning result based on a combination of parallax between the plurality of images acquired from the plurality of imaging sections and a distance to a subject and may be a program for outputting the distance to the subject in the case where parallax between the plurality of images is input. Also, the first learning result may be data representing a correspondence between the parallax between the plurality of images and the distance to the subject. Also, the first learning result may be a program for outputting the distance to the subject on the basis of RGB information of captured images as disclosed in Japanese Patent Laid-Open No. 2016-157188.

The second learning result may be a program for setting, in the case where the subject is an object moving from the imaging range of the large imaging section 510 to the imaging range of the small imaging section 512, the image of the object for the image captured by the small imaging section 512 (e.g., left image or right image) on the basis of the shape of the object represented by the image captured by the large imaging section 510 (e.g., center image). Also, the second learning result may be a program for identifying, in the case where the same object is visible across the center, left, and right images, the shape of the object in the center image 530 and reflect the original shape to be taken on by the object in the left and right images. The technology related to the former second learning result is also disclosed in Japanese Patent Laid-Open No. 2012-203439. The technology related to the latter second learning result is also disclosed in Japanese Patent Laid-Open No. 2005-128959 and Japanese Patent Laid-Open No. 2005-319018.

As described in the first working example, the generation section 526 of the imaging apparatus 500 generates data regarding distance to the subject on the basis of the image captured by the large imaging section 510 and at least two of the plurality of images captured by the plurality of small imaging sections 512. In a fourth working example, the generation section 526 further corrects data regarding the distance to the subject on the basis of the first learning result stored in the learning result storage section. Also, the generation section 526 corrects the image captured by the large imaging section 510 and the images captured by the small imaging sections 512 on the basis of the second learning result stored in the learning result storage section.

Figure 28:
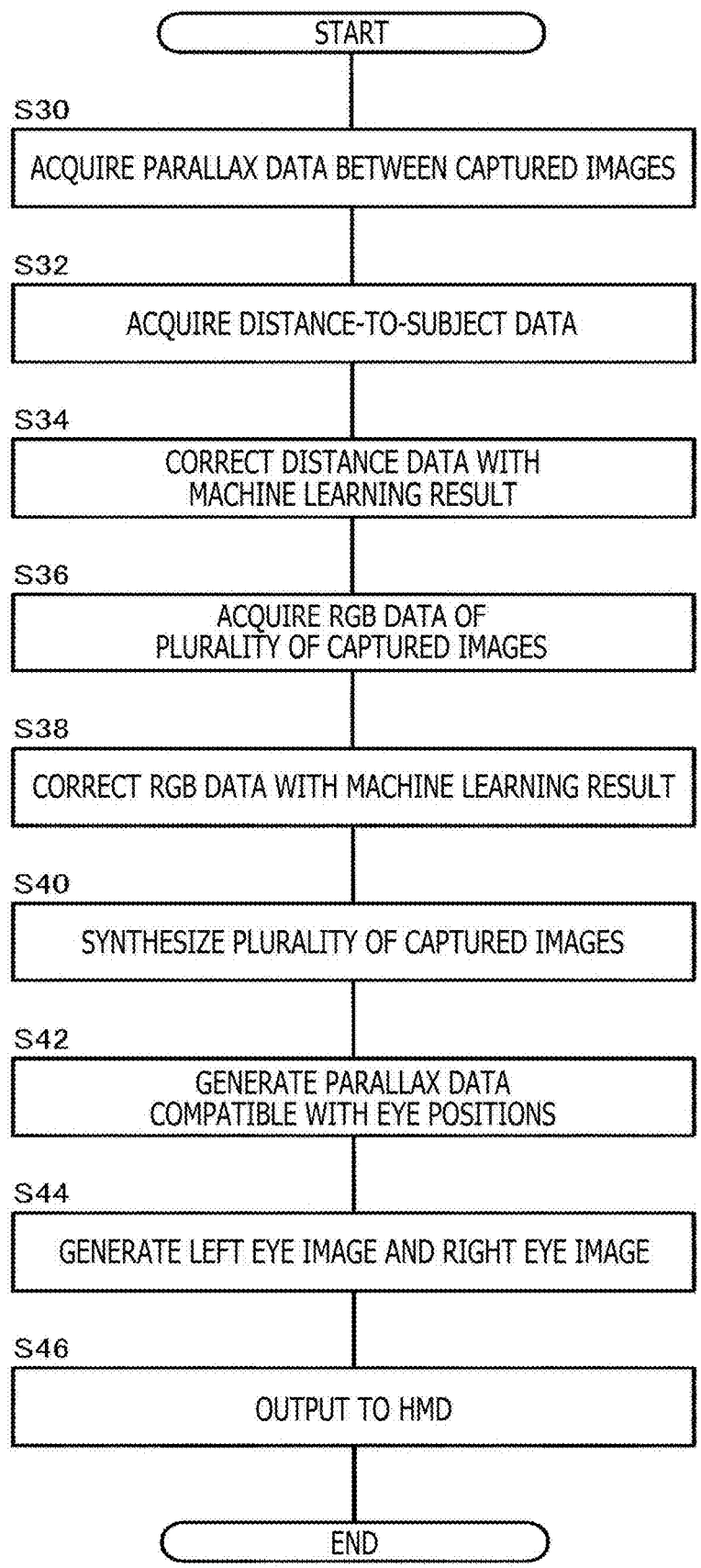
FIG. 28 is a flowchart illustrating processes performed by the generation section in a fourth working example.

FIG. 28 is a flowchart illustrating processes performed by the generation section in the fourth working example. The processes in S30 and S32 in FIG. 28 are the same as those in S10 and S12 in FIG. 25. Therefore, the description thereof will be omitted. The generation section 526 corrects the distance to the subject estimated in S32 in accordance with the first learning result (S34). For example, the mean value of the distance obtained in S32 and the distance obtained by the first learning result may be used as a corrected distance. The process in S36 in FIG. 28 is the same as the process in S14 in FIG. 25. Therefore, the description thereof will be omitted.

The generation section 526 corrects the RGB data acquired in S36 in accordance with the second learning result (S38). For example, the RGB data representing the object identified in the center image 530 may be reflected in the RGB data of the left image 532a or the right image 532b. The subsequent processes in S40 to S46 are the same as those in S16 to S22 in FIG. 25. Therefore, the description thereof will be omitted. It should be noted that only one of the two correction processes, one in S34 and another in S38, may be performed.

Fifth Working Example

In the large imaging section 510 and the plurality of small imaging sections 512, while each imaging section may have a separate lens, the imaging elements (image sensors) of the respective imaging sections may be formed on the same substrate. Shielding members (partitions) may be provided in the substrate to ensure that the imaging element that should detect light that has passed through the lens of a certain imaging section does not detect light that has passed through the lens of other imaging section.

The pixel data acquisition section 522 of the imaging apparatus 500 acquires the pixel values of the region of the imaging element corresponding to the large imaging section 510 as pixel values of the image captured by the large imaging section 510. Also, the pixel data acquisition section 522 acquires the pixel values of the region of the imaging element corresponding to the small imaging sections 512a (or the small imaging sections 512b) as pixel values of the image captured by the small imaging sections 512a (or the small imaging sections 512*b*). In this aspect, the plurality of imaging sections share an imaging element on a single substrate, thus contributing to a reduced number of components of the imaging apparatus 500 and reduced manufacturing costs of the imaging apparatus 500.

In the imaging apparatus 500 of a fifth working example, the image processing section 514 may be provided in the imaging element. Specifically, as described in the related technology, the imaging apparatus 500 may be configured as a stacked image sensor having a logic circuit implementing the function of the image processing section 514 (and/or a control circuit) in the underlying layer of a pixel arrangement. This ensures that many image processing tasks are complete within the image sensor in question, thus achieving speedup of processing, contributing to reduced subsequent processing, and ensuring reduced processing load on the external apparatus.

A description has been given above on the basis of the first to fifth working examples. It is understood by those skilled in the art that these working examples are illustrative, that the constituent elements or the processes can be combined in various ways as modification examples, and that such modification examples also fall within the scope of the present invention. A description will be given below of modification examples.

A first modification example will be described. A polarizer may be provided in at least one of one or more large imaging sections 510 and the plurality of small imaging sections 512. The polarizer allows, of light that has passed through the lens, passage of a polarization component in a given azimuth. Specifically, each of the large imaging sections 510 and the small imaging sections 512 can include an image forming optics 14, an aperture 18, and an imaging element 20. The imaging element 20 may include a 2D array of pixels, and these pixels may have a structure in which microlenses, polarizers, and photodiodes are integrally stacked one on top of the other.

A plurality of types of polarizers having a plurality of types of principal axis angles may be provided in a plurality of imaging sections (or in each pixel of a single imaging section). The first modification example provides a polarization image (or a plurality of types of polarization images corresponding to a plurality of directions). This makes it possible to obtain a normal vector on a subject surface by using the polarization image.

A second modification example related to the first modification example will be described. In at least one of one or more large imaging sections 510 and the plurality of small imaging sections 512, a photodiode is provided in each of a plurality of partial regions obtained by dividing a pixel region corresponding to one microlens in a pixel arrangement including the photodiode (photoelectric conversion section), a unit for converting light that has passed through the microlens into charge. As described in the related technology, a plurality of photodiodes are provided for one microlens, thus making it possible to acquire phase difference images obtained by dividing incident light into two images. Then, the distance to the subject can be acquired by taking advantage of the phase difference represented by the phase difference images.

A third modification example will be described. Pixels capable of detecting four or more wavelength bands (referred to as "special pixels" here) may be provided in at least one of one or more large imaging sections 510 and the plurality of small imaging sections 512. Four or more types of wavelength bands may include, for example, a first wavelength band (red), a second wavelength band (green), a third wavelength band (blue), and other wavelength band (e.g., yellow and magenta). Also, a wavelength band other than visible light (e.g., infrared and ultraviolet) may be included. Data regarding four or more types of wavelength bands is referred to as multi-spectral data and also hyper spectral data.

The imaging apparatus 500 of the third modification example may further include a spectral data storage section that stores data representing a predetermined correspondence between detection results of four or more types of wavelength bands (i.e., spectral characteristics) and an object which is a subject. The generation section 526 may acquire detection results of four or more types of wavelength bands output from the imaging section including special pixels and identify the object corresponding to the detection results by referring to the correspondence stored in the spectral data storage section. The generation section 526 may generate, in the region of the identified object, an image to be output having color data (pixel values) associated in advance with the identified object set therein.

Also, the spectral data storage section may store data representing a correspondence between detection results of four or more types of wavelength bands and types of light sources. The types of light sources may include, for example, a sunlight, a fluorescent lamp, and an LED (Light-Emitting Diode). The generation section 526 may acquire detection results of four or more types of wavelength bands output from the imaging section including special pixels and identify the light source corresponding to the detection results. Then, the generation section 526 may generate an image to be output having colors appropriate to the identified light source set therein. The third modification example facilitates the identification of objects which would otherwise be difficult to identify with visible light (e.g., water and alcohol). It is also easier to estimate light sources.

A fourth modification example will be described. Images captured by the small imaging sections 512 include optical shot noise or other noise. The small imaging sections 512 are small in optical size, making it more likely for a signal-to-noise ratio of images captured by the small imaging sections 512 to be small when the surrounding area darkens. In other words, the signal-to-noise ratio of the small imaging sections 512 is more likely to deteriorate than that of the large imaging sections 510.

In the fourth modification example, the imaging apparatus 500 further includes a measurement section that measures a signal-to-noise ratio of the image captured by each of the plurality of small imaging sections 512. The generation section 526 performs pixel addition on the image captured by each of the plurality of small imaging sections 512 in accordance with the signal-to-noise ratio. A known technique may be used for pixel addition. For example, the generation section 526 may correct the image captured by the small imaging section 512 whose signal-to-noise ratio has fallen below a given threshold by treating a plurality of adjacent pixels (e.g., two adjacent pixels) as one virtual pixel and setting the total of the plurality of pixel values as a pixel value of the virtual pixel. The fourth modification example can keep, to a minimum, deterioration of the signal-to-noise ratio resulting from changes in the surrounding environment.

It should be noted that the imaging apparatus 500 including the plurality of imaging sections and the image processing section 514 has been described in the above working examples. As a modification example, a camera system may be built that includes a plurality of imaging apparatuses and an information processing apparatus. The imaging apparatuses are independent of each other and correspond to the large imaging sections 510 and the small imaging sections 512. The information processing apparatus has the function of the image processing section 514. The plurality of imaging apparatuses and the information processing apparatus work in a coordinated fashion. The technologies described in the respective working examples and modification examples are applicable to the camera system described above.

Any combination of the above embodiments and modification examples is also effective as embodiments of the present invention. New embodiments resulting from the combination have effects of the respective working examples and modification examples combined. Also, it is understood by those skilled in the art that the function to be achieved by each of the constituent elements described in claims is realized by that constituent element alone or coordination between the constituent elements.

REFERENCE SIGNS LIST

500 Imaging apparatus, 510 Large imaging section, 512 Small imaging section, 514 Image processing section, 520 Characteristic storage section, 522 Pixel data acquisition section, 524 Adjustment section, 526 Generation section, 528 Output section.

INDUSTRIAL APPLICABILITY

The present invention is applicable to an apparatus or a system for processing images.

The invention claimed is:

1. An imaging apparatus comprising:
a first imaging section adapted to capture an image of a subject;
a plurality of second imaging sections provided at positions around the first imaging section to capture images of the subject and being smaller in optical size than the first imaging section; and
an image processing section adapted to generate data to be output on a basis of the image captured by the first imaging section and the images captured by the plurality of second imaging sections,
wherein the image processing section synthesizes the image captured by the first imaging section and the images captured by the plurality of second imaging sections and changes a synthesis ratio according to an image synthesis position.

2. The imaging apparatus of claim 1, wherein the image processing section generates at least one of two pieces of data, namely, data regarding parallax and data regarding a distance to the subject, on the basis of the image captured by the first imaging section and at least two of the images captured by the plurality of second imaging sections.

3. The imaging apparatus of claim 1, further comprising:
a plurality of first imaging sections, wherein
the plurality of first imaging sections capture images of subjects located in different directions from each other, and
at least one of the second imaging sections is provided between the plurality of first imaging sections.

4. The imaging apparatus of claim 3, wherein lens tip portions of the plurality of first imaging sections are provided closer to the subjects than lens tip portions of the plurality of second imaging sections.

5. The imaging apparatus of claim 1, wherein while each of the first imaging section and the plurality of second imaging sections has a separate lens, imaging elements thereof are formed on a same substrate.

6. The imaging apparatus of claim 5, wherein the imaging element includes the image processing section.

7. The imaging apparatus of claim 1, wherein a polarizer for allowing, of light that has passed through the lens, passage of a polarization component in a given azimuth is provided in at least one of the first imaging section and the plurality of second imaging sections.

8. The imaging apparatus of claim 1, wherein in at least one of the first imaging section and the plurality of second imaging sections, a photoelectric conversion section is provided in each of a plurality of partial regions obtained by dividing a pixel region corresponding to one of the lens in a pixel arrangement including the photoelectric conversion section, a unit for converting light that has passed through the lens into charge.

9. The imaging apparatus of claim 1, wherein pixels capable of detecting four or more wavelength bands are provided in at least one of the first imaging section and the plurality of second imaging sections.

10. The imaging apparatus of claim 1, wherein the image processing section generates data regarding a distance to the subject on the basis of the image captured by the first imaging section and at least two of the plurality of images captured by the plurality of second imaging sections and corrects the data regarding a distance on a basis of data acquired in advance by machine learning.

11. The imaging apparatus of claim 1, wherein the image processing section corrects the image captured by the second imaging section on a basis of the image captured by the first imaging section and the data acquired in advance by machine learning.

12. The imaging apparatus of claim 1, further comprising:
a storage section adapted to store data regarding a characteristic of the image captured by the first imaging section and data regarding a characteristic of the image captured by each of the plurality of second imaging sections,
wherein the image processing section makes adjustments in such a manner as to achieve a match between the characteristic of the image captured by the first imaging section and the characteristic of the image captured by each of the plurality of second imaging sections.

13. The imaging apparatus of claim 12, wherein the image processing section corrects the image captured by each of the plurality of second imaging sections in such a manner as to achieve a match between the characteristic of the image captured by each of the plurality of second imaging sections and the characteristic of the image captured by the first imaging section.

14. The imaging apparatus of claim 1, wherein the image processing section performs pixel addition on the image captured by each of the plurality of second imaging sections in accordance with a signal-to-noise ratio thereof.

15. The imaging apparatus of claim 1, further comprising:
a plurality of first imaging sections adapted to perform image capture in a same direction,
wherein the plurality of second imaging sections are provided at positions around the plurality of first imaging section.

16. The imaging apparatus of claim 15, wherein at least the two second imaging sections are provided at positions more than an inter-pupillary distance of a user apart.

17. The imaging apparatus of claim 15, wherein the image processing section derives a distance to the subject in a region of the image captured by the first imaging section that is not visible in the image captured by another first imaging section on a basis of the image captured by the second imaging section provided around the first imaging section.

18. An imaging apparatus comprising:
- a first imaging section adapted to capture an image of a subject;
- a plurality of second imaging sections provided at positions around the first imaging section to capture images of the subject and being smaller in optical size than the first imaging section; and
- an image processing section adapted to generate data to be output on a basis of the image captured by the first imaging section and the images captured by the plurality of second imaging sections,
- wherein at least one of:
  - (a) a polarizer for allowing, of light that has passed through the lens, passage of a polarization component in a given azimuth is provided in at least one of the first imaging section and the plurality of second imaging sections,
  - (b) in at least one of the first imaging section and the plurality of second imaging sections, a photoelectric conversion section is provided in each of a plurality of partial regions obtained by dividing a pixel region corresponding to one of the lens in a pixel arrangement including the photoelectric conversion section, a unit for converting light that has passed through the lens into charge,
  - (c) pixels capable of detecting four or more wavelength bands are provided in at least one of the first imaging section and the plurality of second imaging sections,
  - (d) the image processing section generates data regarding a distance to the subject on the basis of the image captured by the first imaging section and at least two of the plurality of images captured by the plurality of second imaging sections and corrects the data regarding a distance on a basis of data acquired in advance by machine learning, wherein
  - (e) the image processing section corrects the image captured by the second imaging section on a basis of the image captured by the first imaging section and the data acquired in advance by machine learning,
  - (f) the imaging apparatus further comprises: a storage section adapted to store data regarding a characteristic of the image captured by the first imaging section and data regarding a characteristic of the image captured by each of the plurality of second imaging sections, wherein the image processing section makes adjustments in such a manner as to achieve a match between the characteristic of the image captured by the first imaging section and the characteristic of the image captured by each of the plurality of second imaging sections,
  - (g) the image processing section corrects the image captured by each of the plurality of second imaging sections in such a manner as to achieve a match between the characteristic of the image captured by each of the plurality of second imaging sections and the characteristic of the image captured by the first imaging section, and
  - (h) the image processing section performs pixel addition on the image captured by each of the plurality of second imaging sections in accordance with a signal-to-noise ratio thereof.

* * * * *